United States Patent
Ahr et al.

(10) Patent No.: US 10,849,213 B2
(45) Date of Patent: Nov. 24, 2020

(54) DROPLET GENERATION FOR A LASER PRODUCED PLASMA LIGHT SOURCE

(71) Applicant: KLA-Tencor Corporation, Milpitas, CA (US)

(72) Inventors: Brian Ahr, San Jose, CA (US); Alexander Bykanov, San Diego, CA (US); Rudy F. Garcia, Union City, CA (US); Layton Hale, Castro Valley, CA (US); Oleg Khodykin, San Diego, CA (US)

(73) Assignee: KLA Corporation, Milpitas, CA (US)

(*) Notice: Subject to any disclaimer, the term of this patent is extended or adjusted under 35 U.S.C. 154(b) by 145 days.

(21) Appl. No.: 15/261,639

(22) Filed: Sep. 9, 2016

(65) Prior Publication Data
US 2017/0131129 A1    May 11, 2017

Related U.S. Application Data

(60) Provisional application No. 62/253,631, filed on Nov. 10, 2015.

(51) Int. Cl.
*H05G 2/00* (2006.01)

(52) U.S. Cl.
CPC ............ *H05G 2/003* (2013.01); *H05G 2/006* (2013.01); *H05G 2/008* (2013.01)

(58) Field of Classification Search
CPC ........ H05G 1/003; H05G 1/005; H05G 1/006; H05G 2/003; H05G 2/005; H05G 2/006; G03F 7/70033
See application file for complete search history.

(56) References Cited

U.S. PATENT DOCUMENTS

| 5,565,677 A | 10/1996 | Wexler |
| 6,320,937 B1 | 11/2001 | Mochizuki |

(Continued)

FOREIGN PATENT DOCUMENTS

| TW | 2014189902 A | 5/2014 |
| WO | 2014062351 A2 | 4/2014 |

(Continued)

OTHER PUBLICATIONS

Amano, Laser-Plasma Extreme Ultraviolet Source Incorporating a Cryogenic Xe Target, Recent Advances in Nanofabrication Techniques and Applications (chapter 18), Dec. 2, 2011, 353-368, Intech, Japan / online, pp. 353-368.

(Continued)

*Primary Examiner* — Wyatt A Stoffa
(74) *Attorney, Agent, or Firm* — Suiter Swantz pc llo

(57) ABSTRACT

The present disclosure is directed to a device having a nozzle for dispensing a liquid target material; one or more intermediary chamber(s), each intermediary chamber positioned to receive target material and formed with an exit aperture to output target material for downstream irradiation in a laser produced plasma (LPP) chamber. In some disclosed embodiments, control systems are included for controlling one or more of gas temperature, gas pressure and gas composition in one, some or all of a device's intermediary chamber(s). In one embodiment, an intermediary chamber having an adjustable length is disclosed.

14 Claims, 24 Drawing Sheets

(56) References Cited

U.S. PATENT DOCUMENTS

| | | | |
|---|---|---|---|
| 6,493,423 B1* | 12/2002 | Bisschops | G03F 7/70033 |
| | | | 378/119 |
| 7,095,038 B2 | 8/2006 | Barthod | |
| 7,247,870 B2 | 7/2007 | Ershov | |
| 7,453,077 B2 | 11/2008 | Bowering | |
| 7,655,925 B2 | 2/2010 | Bykanov | |
| 7,671,349 B2 | 3/2010 | Bykanov | |
| 7,812,329 B2 | 10/2010 | Bykanov | |
| 8,198,615 B2 | 6/2012 | Bykanov | |
| 8,258,485 B2 | 10/2012 | Levesque | |
| 8,723,147 B2 | 5/2014 | Abhari | |
| 8,963,110 B2 | 2/2015 | Hale | |
| 2003/0223546 A1* | 12/2003 | McGregor | H05G 2/003 |
| | | | 378/143 |
| 2004/0129896 A1* | 7/2004 | Schmidt | H05G 2/008 |
| | | | 250/492.2 |
| 2006/0017026 A1 | 1/2006 | Hergenhan et al. | |
| 2006/0043319 A1* | 3/2006 | Gaebel | H05G 2/003 |
| | | | 250/504 R |
| 2010/0032590 A1 | 11/2010 | Bykanov | |
| 2011/0174996 A1* | 7/2011 | Someya | H05G 2/003 |
| | | | 250/504 R |
| 2011/0248191 A1* | 10/2011 | Fomenkov | H05G 2/006 |
| | | | 250/504 R |
| 2012/0050706 A1 | 3/2012 | Levesque | |
| 2012/0085922 A1* | 4/2012 | Yabu | H05G 2/008 |
| | | | 250/432 R |
| 2013/0048878 A1* | 2/2013 | Mizoguchi | H05G 2/006 |
| | | | 250/492.1 |
| 2013/0062538 A1* | 3/2013 | Kodama | H05G 2/006 |
| | | | 250/504 R |
| 2013/0277452 A1* | 10/2013 | Yabu | G03F 7/70033 |
| | | | 239/102.1 |
| 2014/0008552 A1* | 1/2014 | Umeda | H05G 2/008 |
| | | | 250/504 R |
| 2014/0085724 A1 | 3/2014 | Chilese | |
| 2014/0166051 A1 | 6/2014 | Umstadter | |
| 2014/0246607 A1* | 9/2014 | Bykanov | H05G 2/008 |
| | | | 250/504 R |
| 2014/0306115 A1 | 10/2014 | Kuritsyn | |
| 2014/0376842 A1 | 12/2014 | Chilese | |
| 2015/0008335 A1 | 1/2015 | Bykanov | |
| 2015/0029478 A1* | 1/2015 | Schimmel | H05G 2/006 |
| | | | 355/67 |
| 2015/0076359 A1 | 3/2015 | Bykanov | |
| 2015/0156855 A1* | 6/2015 | Ershov | H05G 2/008 |
| | | | 250/504 R |
| 2015/0293456 A1* | 10/2015 | Dijksman | H05G 2/006 |
| | | | 355/67 |
| 2016/0150625 A1* | 5/2016 | McGeoch | H05G 2/005 |
| | | | 250/504 R |

FOREIGN PATENT DOCUMENTS

| | | |
|---|---|---|
| WO | 2014161698 A1 | 10/2014 |
| WO | 2014168519 A1 | 10/2014 |
| WO | 2015055374 A1 | 4/2015 |

OTHER PUBLICATIONS

Amano, Laser-Plasma Debris from a Rotating Cryogenic-Solid-Xe Target, Rev Sci. Instrum. 81, 023104, Feb. 5, 2010, online, pp. 023104-1-023104-6.

Amano, Characterization of a Laser-Plasma Extreme-Ultraviolet Source using a Rotating Cryogenic Xe Target, Appl Phys B 101: 213-219 (2010), online, pp. 213-219.

Fukugaki, Rotating Cryogenic Drum Supplying Solid Xe Target to Generate Extreme Ultraviolet Radiation, Rev Sci. Instrum. 77, 063114, Jun. 27 2006, online, pp. 063114-1-063114-4.

M. Buscher, Production of Hydrogen, Nitrogen and Argon Pellets with the Moscow-Julich Pellet Target, International Journal of Modern Physics E, vol. 18, No. 2 (2009) 505-510, World Scientific Publishing Company, online, pp. 505-510.

Office Action dated Nov. 1, 2019 for Taiwan Patent Application No. 105130999.

* cited by examiner

DROPLET GENERATION FOR A LASER PRODUCED PLASMA LIGHT SOURCE

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC § 119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional Patent Application entitled DROPLET GENERATION FOR A LASER PRODUCED PLASMA LIGHT SOURCE, naming Brian Ahr, Alexander Bykanov, Rudy Garcia, Layton Hale, and Oleg Khodykin as inventor, filed Nov. 10, 2015, Application Ser. No. 62/253,631, which is incorporated herein by reference in the entirety.

TECHNICAL FIELD

The present disclosure relates generally to plasma-based light sources for generating light in the extreme ultraviolet (EUV) range (i.e., light having a wavelength in the range of 10 nm-124 nm and including light having a wavelength of 13.5 nm). Some embodiments described herein are high brightness light sources particularly suitable for use in metrology and/or mask inspection activities, (e.g., actinic mask inspection and including blank or patterned mask inspection). More generally, the plasma-based light sources described herein can also be used (directly or with appropriate modification) as so-called high volume manufacturing (HVM) light sources for patterning chips.

BACKGROUND

Plasma-based light sources, such as laser-produced plasma (LPP) sources are often used to generate extreme ultraviolet (EUV) light for applications such as defect inspection, photolithography, or metrology. In overview, in these plasma light sources, light having the desired wavelength is emitted by plasma formed from a target material having an appropriate line-emitting or band-emitting element, such as Xenon, Tin, Lithium or others. For example, in an LPP source, a target material is irradiated by an excitation source, such as a laser beam, to produce plasma.

For these sources, the light emanating from the plasma is often collected via a reflective optic, such as a collector optic (e.g., a near-normal incidence or grazing incidence mirror). The collector optic directs, and in some cases focuses, the collected light along an optical path to an intermediate location where the light is then used by a downstream tool, such as a lithography tool (i.e., stepper/scanner), a metrology tool or a mask/pellicle inspection tool.

In some applications, Xenon, in the form of a jet or droplet (i.e., liquid droplet or frozen pellet) can offer certain advantages when used as a target material. For example, a Xenon target material irradiated by a 1 µm drive laser can be used to produce a relatively bright source of EUV light that is particularly suitable for use in a metrology tool or a mask/pellicle inspection tool.

Xenon and other cryogenic gases form liquid droplets and solid pellets under special conditions of pressure and temperature. In one arrangement, Xenon can be pressurized and cooled such that it liquefies. The liquid Xenon is then emitted from a nozzle as a jet and subsequently droplets are formed from the decaying jet. The droplets (e.g., liquid droplets or frozen pellet droplets) then travel to a site in a vacuum environment where the droplets are irradiated by a laser beam to produce an EUV emitting plasma. As the jet/droplets travel, the Xenon evaporates creating Xenon gas which can strongly absorb EUV light leading to significant losses in EUV transmission. For example, the environment in the LPP chamber where the target material is irradiated is generally held to a total pressure of less than about 40 mTorr and a partial pressure of Xenon of less than about 5 mTorr in order to allow the EUV light to propagate without being absorbed. In more quantitative terms, the light transmission of 13.5 nm EUV light through 1 Torr*cm (pressure*distance) of Xenon gas at room temperature is only about 44 percent.

Droplet positional stability is another factor that is often considered when designing an LPP system. Specifically, for good conversion efficiency, it is desired that the droplets reach the irradiation location accurately to ensure a good coupling between the target material droplet and the focused laser beam. In this regard, the environment that the target material experiences from the nozzle to the irradiation site can affect positional stability. Factors affecting positional stability can include the path length, conditions such as temperature and pressure along the path (which can affect evaporation rate) and any gas flows along the path.

Therefore, it is desirable to create a Droplet Generator for a Laser Produced Plasma Light Source that cures the shortcomings of the prior art.

SUMMARY

In a first aspect, a device is disclosed having a nozzle for dispensing a liquid target material; an intermediary chamber positioned to receive target material, the intermediary chamber formed with an exit aperture to output target material for downstream irradiation in an LPP chamber; and a system for controlling gas composition in the intermediary chamber by introducing a measured flow of gas into the intermediary chamber.

For this aspect, the device can be a single intermediary chamber device or a multiple intermediary chamber device (i.e., having two or more intermediary chambers).

In one embodiment of this aspect, an intermediary chamber has a channel extending from a first end to a second end with the exit aperture at the second end.

In a particular embodiment, an intermediary chamber has a channel extending from a first end to a second end with the exit aperture at the second end and a channel length from the first end to the second end is in the range of 20 µm to 500 µm. In one particular embodiment, an intermediary chamber has an internal surface extending from the channel at the first end, the internal surface having a shape selected from the group of shapes consisting of frustoconical, concave, convex, flat and gradually tapering. In some implementations, the channel may have a specific profile, for example, a Lavelle nozzle profile at least for some section of the channel.

In one embodiment, the exit aperture of an intermediary chamber can have a diameter in the range of 100 µm to 1000 µm.

In a particular embodiment, an intermediary chamber has a channel extending from a first end to a second end with the exit aperture at the second end, the channel defines an axis and the intermediary chamber has a concave internal surface extending from the channel at the first end to an edge positioned at an axial distance from the exit aperture in the range of 2 mm to 10 mm.

In one embodiment, an intermediary chamber has a channel extending from a first end to a second end with the exit aperture at the second end, the channel defines an axis and the intermediary chamber has a concave internal surface extending from the channel at the first end to establish an angle between the internal surface and the axis greater than 60 degrees.

In one implementation of this aspect, the liquid target material is Xenon (or includes Xenon) and the system for controlling gas composition in the intermediary chamber by introducing a measured flow of gas into the intermediary chamber introduces a gas other than Xenon into the intermediary chamber. For example, a gas having a higher EUV transmission than the target material gas (e.g., Xenon gas), such as Hydrogen, Helium, HBr, Argon, Nitrogen or combinations thereof, can be introduced by the system for controlling gas composition.

For this aspect, the device can also include a system for controlling gas temperature in one or more intermediary chamber(s) having one or more temperature control elements. For example, a temperature control element can be a fin(s) disposed within an intermediary chamber, a fin(s) positioned outside an intermediary chamber, a Peltier cooling element, a plate formed with an internal fluid passageway for passing a heat transfer fluid through the plate, or an insulated plate.

In one embodiment, the device can include a motorized iris to establish the exit aperture of an intermediary chamber.

In one arrangement of this aspect, a second intermediary chamber is positioned to receive target material from a first intermediary chamber exit aperture and is formed with an exit aperture to output target material for downstream irradiation in the LPP chamber, and the device includes a system for controlling gas composition in the first intermediary chamber by introducing a measured flow of gas into the first intermediary chamber and system for controlling gas composition in the second intermediary chamber by introducing a measured flow of gas into the second intermediary chamber. With this arrangement, an embodiment can include a Xenon liquid target material and the system for controlling gas composition in the first intermediary chamber can control the partial pressure of Xenon to a Xenon partial pressure $p_{Xe1}$, and the system for controlling gas composition in the second intermediary chamber can control the partial pressure of Xenon to a Xenon partial pressure $p_{Xe2}$, with $p_{Xe1} > p_{Xe2}$.

In another aspect, a device is disclosed that includes a nozzle for dispensing a liquid target material; a first intermediary chamber positioned to receive target material, the first intermediary chamber formed with an exit aperture to output target material for downstream irradiation in a laser produced plasma (LPP) chamber; and a second intermediary chamber positioned to receive target material, the second intermediary chamber formed with an exit aperture to output target material for downstream irradiation in the LPP chamber.

In one embodiment of this aspect, the device includes a third intermediary chamber positioned to receive target material, the third intermediary chamber formed with an exit aperture to output target material for downstream irradiation in the LPP chamber. In a particular embodiment, the second intermediary chamber receives target material from the first intermediary chamber exit aperture, the third intermediary chamber receives target material from the second intermediary chamber exit aperture and the first intermediary chamber exit aperture has a diameter, $d_1$, the second intermediary chamber exit aperture has a diameter, $d_2$, and the third intermediary chamber exit aperture has a diameter, $d_3$, with $d_1 > d_2 > d_3$ to establish an aerodynamic lens.

In one particular embodiment of this aspect, the second intermediary chamber receives target material from the first intermediary chamber exit aperture and the device further comprises a system for controlling gas pressure in the first intermediary chamber at a pressure, $p_1$, and a system for controlling gas pressure in the second intermediary chamber at a pressure, $p_2$, with $p_1 > p_2$. For example, the system for controlling gas pressure in the first intermediary chamber can include a sub-system for introducing a measured flow of gas into the first intermediary chamber and a sub-system for pumping a measured flow of gas from the first intermediary chamber.

In an embodiment of this aspect, the second intermediary chamber receives target material from the first intermediary chamber exit aperture and the device includes a system for controlling gas temperature in the first intermediary chamber at a temperature, $t_1$, and a system for controlling gas temperature in the second intermediary chamber at a temperature, $t_2$, with $t_1 > t_2$.

In an embodiment of this aspect, the system for controlling gas temperature in an intermediary chamber comprises a temperature control element selected from the group of temperature control elements consisting of a fin disposed within an intermediary chamber, a fin positioned outside an intermediary chamber, a Peltier cooling element, a plate formed with an internal fluid passageway for passing a heat transfer fluid through the plate and an insulated plate.

In another aspect, a device is disclosed that includes a nozzle for dispensing a liquid target material for irradiation by a drive laser in a laser produced plasma (LPP) chamber and an assembly establishing an intermediary chamber positioned to receive target material at a chamber input location, the intermediary chamber formed with an exit aperture to output target material for downstream irradiation in a laser produced plasma chamber, the intermediary chamber defining a length, L, between the input location and exit aperture, and wherein the assembly has a subsystem for adjusting the length, L, of the intermediary chamber while the chamber is maintained in a pressurized state.

For this aspect, the device can be a single intermediary chamber device or a multiple intermediary chamber device (i.e., having two or more intermediary chambers).

In one embodiment of the aspect, the assembly includes a first component having a cylindrical wall of inner diameter, $D_1$ and a second component having a cylindrical wall of outer diameter, $D_2$ with $D_1 > D_2$, and a seal positioned between the first component cylindrical wall and second component cylindrical wall. In a particular implementation, the first cylindrical wall defines an axis and the assembly further includes a motor arranged to move one of the first and second components axially to vary the length, L.

In another embodiment of the aspect, the assembly includes a bellows having a first end and a second end and a motor arranged to move the first end relative to the second end to vary the length, L.

In some embodiments, a device as described herein can be incorporated into an inspection system such as a blank or patterned mask inspection system. In an embodiment, for example, an inspection system may include a light source delivering radiation to an intermediate location, an optical system configured to illuminate a sample with the radiation, and a detector configured to receive illumination that is reflected, scattered, or radiated by the sample along an imaging path. The inspection system can also include a computing system in communication with the detector that is configured to locate or measure at least one defect of the sample based upon a signal associated with the detected illumination.

In some embodiments, a device as described herein can be incorporated into a lithography system. For example, the light source can be used in a lithography system to expose a resist coated wafer with a patterned beam of radiation. In an embodiment, for example, a lithography system may include a light source delivering radiation to an intermediate location, an optical system receiving the radiation and establishing a patterned beam of radiation and an optical system for delivering the patterned beam to a resist coated wafer.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings. At the outset, it should be appreciated that like drawing numbers on different drawing views identify identical, or functionally similar, structural elements of the disclosure. It is to be understood that the disclosure as claimed is not limited to the disclosed aspects. Furthermore, it is understood that this disclosure is not limited to the particular methodology, materials and modifications described and as such may, of course, vary. It is also understood that the terminology used herein is for the purpose of describing particular aspects only, and is not intended to limit the scope of the present disclosure.

Figure 1:
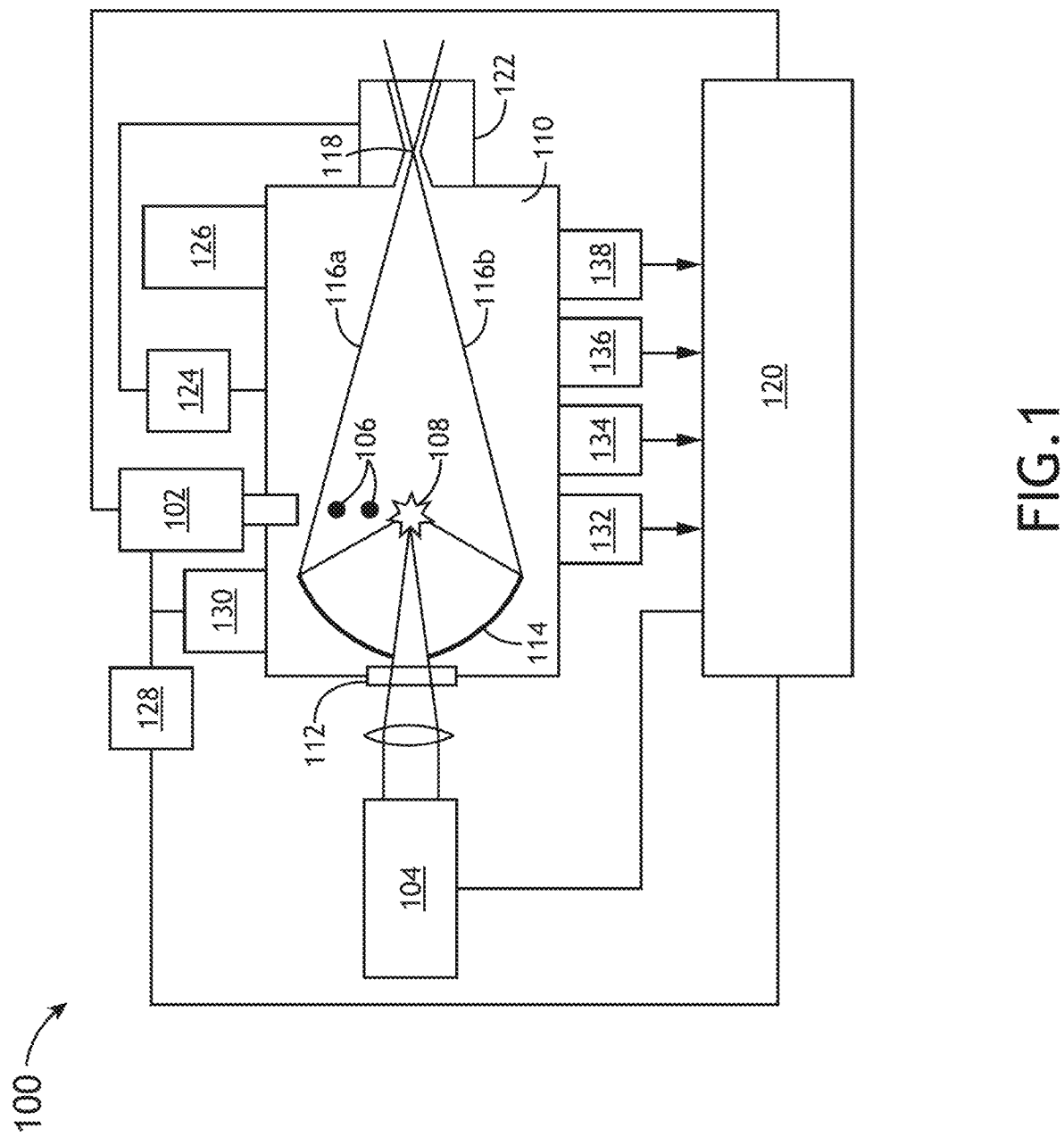
FIG. 1 is a simplified schematic diagram illustrating an LPP light source, in accordance with one or more embodiments of the present disclosure.

FIG. 1 shows an embodiment of a light source (generally designated 100) for producing EUV light and a droplet generator 102. For example, the light source 100 may be configured to produce in-band EUV light (e.g., light having a wavelength of 13.5 nm with 2% bandwidth). As shown, the light source 100 includes an excitation source 104, such as a drive laser, configured to irradiate a target material 106 at an irradiation site 108 to produce an EUV light emitting plasma in a laser produced plasma chamber 110. In some cases, the target material 106 may be irradiated by a first pulse (pre-pulse) followed by a second pulse (main pulse) to produce plasma. As an example, for a light source 100 that is configured for actinic mask inspection activities, an excitation source 104 consisting of a pulsed drive laser having a solid state gain media such as Nd:YAG outputting light at approximately 1 μm and a target material 106 including Xenon may present certain advantages in producing a relatively high brightness EUV light source useful for actinic mask inspection. Other drive lasers having a solid state gain media such as Er:YAG, Yb:YAG, Ti:Sapphire or Nd:Vanadate may also be suitable. Gas-discharge lasers, including excimer lasers, may also be used if they provide sufficient output at the required wavelength. An EUV mask inspection system may only require EUV light in the range of about 10 W, though with high brightness in a small area. In this case, to generate EUV light of sufficient power and brightness for a mask inspection system, total laser output in the range of a few kilowatts may be suitable, which output is focused onto a small target spot, typically less than about 100 μm in diameter. On the other hand, for high volume manufacturing (HVM) activities such as photolithography, an excitation source 104 consisting of a drive laser having a high power gas-discharge $CO_2$ laser system with multiple amplification stages and outputting light at approximately 10.6 μm and a target material 106 including Tin may present certain advantages including the production of in-band EUV light with relatively high power with good conversion efficiency.

Continuing with reference to FIG. 1, for the light source 100, the excitation source 104 can be configured to irradiate the target material 106 at an irradiation site 108 with a focused beam of illumination or a train of light pulses delivered through a laser input window 112. As further shown, some of the light emitted from the irradiation site 108, travels to a collector optic 114 (e.g., near normal incidence mirror) where it is reflected as defined by extreme rays 116a and 116b to an intermediate location 118. The collector optic 114 can be a segment of a prolate spheroid having two focal points having a high-quality polished surface coated with a multilayer mirror (e.g., Mo/Si or NbC/Si) optimized for in-band EUV reflection. In some embodiments, the reflective surface of the collector optic 114 has a surface area in the range of approximately 100 and 10,000 $cm^2$ and may be disposed approximately 0.1 to 2 meters from the irradiation site 108. Those skilled in the art will appreciate that the foregoing ranges are exemplary and that various optics may be used in place of, or in addition to, the prolate spheroid mirror for collecting and directing light to an intermediate location 118 for subsequent delivery to a device utilizing EUV illumination, such as an inspection system or a photolithography system.

For the light source 100, LPP chamber 110 is a low pressure container in which the plasma that serves as the EUV light source is created and the resulting EUV light is collected and focused. EUV light is strongly absorbed by gases, thus, reducing the pressure within LPP chamber 110 reduces the attenuation of the EUV light within the light source. Typically, an environment within LPP chamber 110 is maintained at a total pressure of less than 40 mTorr (e.g., for Argon buffer gas), or higher for $H_2$ or Helium buffer gas, and a partial pressure of Xenon of less than 5 mTorr to allow EUV light to propagate without being substantially absorbed. A buffer gas, such as Hydrogen, Helium, Argon, or other inert gases, may be used within the vacuum chamber.

Droplet generator 102 is arranged to deliver droplets of target material 106 into LPP chamber 110 in such a way that a droplet will intersect irradiation site 108 at the same time as a focused pulse of light from excitation source 104 reaches the irradiation site. As used herein, by "droplet," it is generally meant a small amount of material that will be acted upon by radiation emitted from a laser and thereby converted to plasma. A "droplet" may exist in gas, liquid, or solid phases. By "pellet," it is generally meant a droplet that is in a solid phase, such as by freezing upon moving into a vacuum chamber. As an example, target material 106 may comprise droplets of liquid or solid Xenon, though target material 106 may comprise other materials suitable for conversion to plasma, such as other gases Tin or Lithium. Droplet direction and timing adjustments to droplet generator 102 can be controlled by control system 120. In some cases, a charge may be placed on the droplet and one or more electric or magnetic fields may be applied to steer/stabilize the droplets (not shown).

As further shown in FIG. 1, the EUV beam at intermediate location 118 can be projected into internal focus module 122 which can serve as a dynamic gas lock to preserve the low-pressure environment within LPP chamber 110, and protect the systems that use the resulting EUV light from any debris generated by the plasma creation process.

Light source 100 can also include a gas supply system 124 in communication with control system 120, which can provide target material and other gases (see below) to droplet generator 102 and can control injection of protective buffer gas(ses) into LPP chamber 110 (e.g., via port 126) and can supply buffer gas to protect the dynamic gas lock function of internal focus module 122. A vacuum system 128 in communication with control system 120, e.g., having one or more pumps, can be provided to establish and maintain the low pressure environment of LPP chamber 110 (e.g., via port 130) and in some cases, provide pumping for the droplet generator 102 (see discussion below). In some cases, target material and/or buffer gas(ses) recovered by the vacuum system 128 can be recycled.

Continuing with reference to FIG. 1, it can be seen that light source 100 can include a target material sensor 132 to measure droplet location and/or timing. This data can then be used to adjust droplet direction and/or adjust timing of the droplet generator 102 and/or excitation source 104 to synchronize the droplet generator 102 and excitation source 104. Also, a diagnostic tool 134 can be provided for imaging the EUV plasma and an EUV power meter 136 can be provided to measure the EUV light power output. A gas monitoring sensor 138 can be provided to measure the temperature and pressure of the gas within LPP chamber 110. All of the foregoing sensors can communicate with the control system 120, which can control real-time data acquisition and analysis, data logging, and real-time control of the various EUV light source sub-systems, including the excitation source 104 and droplet generator 102.

Figure 2:
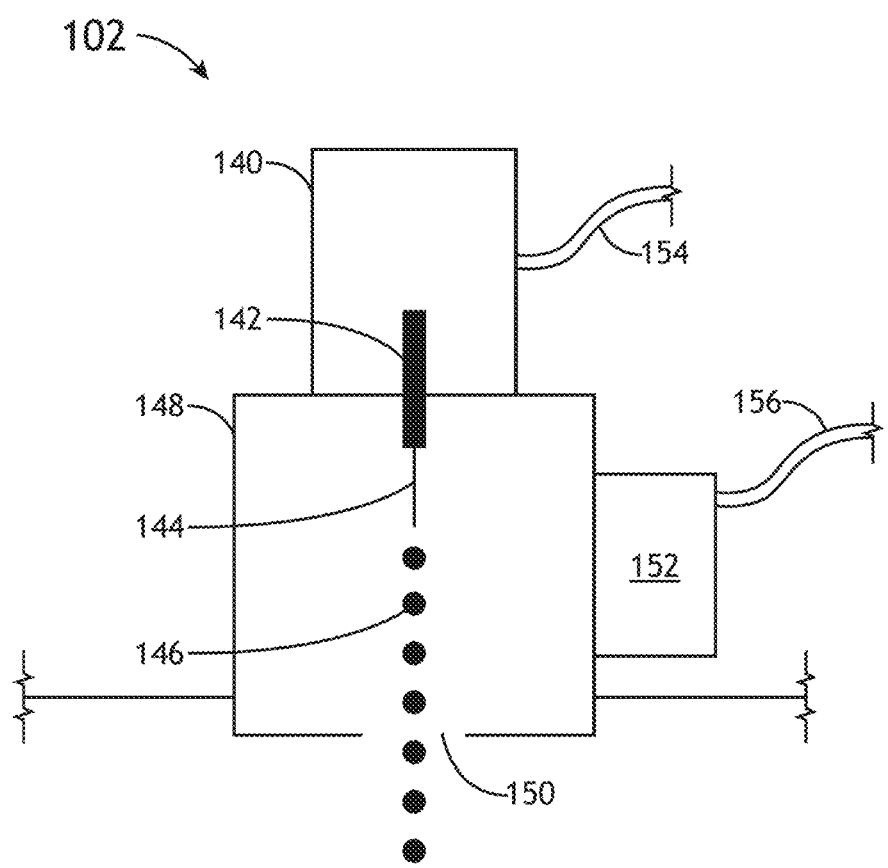
FIG. 2 is a simplified schematic diagram illustrating a droplet generator having a single intermediary chamber, in accordance with one or more embodiments of the present disclosure.

FIG. 2 shows an example of a droplet generator 102 for use in the light source 100 shown in FIG. 1. As shown, the droplet generator 102 can include a jet generator 140 having a nozzle 142 dispensing a liquid target material as a jet 144 which subsequently breaks up into droplets 146 within an intermediary chamber 148. More details regarding jet generator 140 are provided below with reference to FIG. 4. Also shown in FIG. 2, the intermediary chamber 148 can be formed with an exit aperture 150 to output target material for downstream irradiation in an LPP chamber 110. FIG. 2 also shows that an environmental control system 152 can be provided for controlling one or more of gas composition, gas temperature and gas pressure in the intermediary chamber 148. Lines 154, 156 illustrate that the jet generator 140 and environmental control system 152 can communicate with the control system 120 (see FIG. 1).

Figure 3:
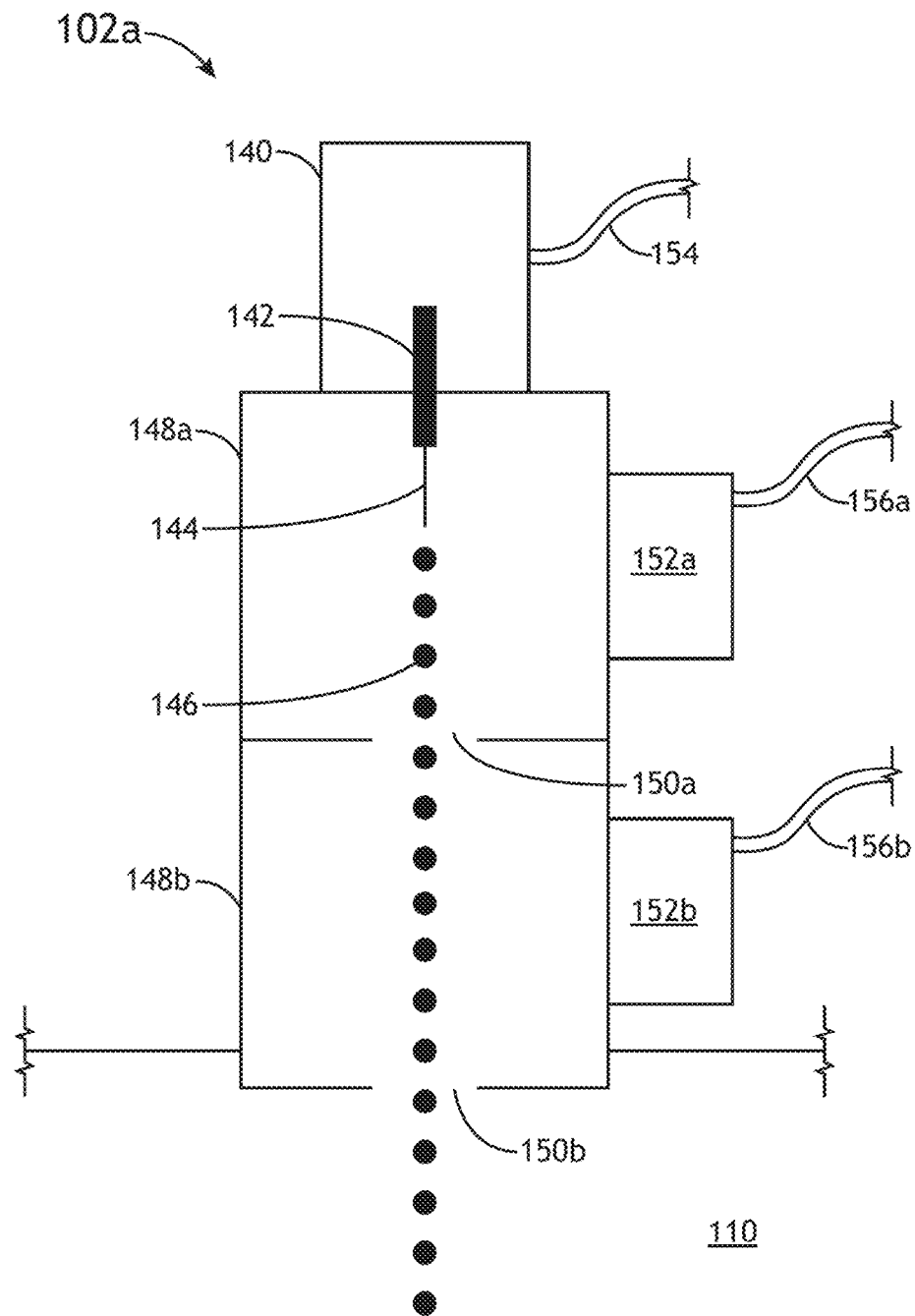
FIG. 3 is a simplified schematic diagram illustrating a droplet generator having multiple intermediary chambers, in accordance with one or more embodiments of the present disclosure.

FIG. 3 shows an example of a droplet generator 102a for use in the light source 100 shown in FIG. 1 having multiple intermediary chambers 148a, 148b positioned, in series, along the target material path. As shown, the droplet generator 102a can include a jet generator 140 having a nozzle 142 dispensing a liquid target material as a jet 144 which subsequently breaks up into droplets 146 within an intermediary chamber 148a, 148b. Also shown in FIG. 3, each intermediary chamber 148a, 148b can be formed with a respective exit aperture 150a, 150b to output target material for downstream irradiation in an LPP chamber 110. FIG. 3 also shows that environmental control systems 152a, 152b can be provided for controlling one or more of gas composition, gas temperature and gas pressure in each respective intermediary chamber 148a, 148b. Lines 154, 156a and 156b illustrate that the jet generator 140 and environmental control systems 152a, 152b can communicate with the control system 120 (see FIG. 1). Although the droplet generator 102a of FIG. 3 is shown having two intermediary chambers 148a, 148b, it is to be appreciated that the droplet generators described herein can include more than two (e.g., three, four, five or more) intermediary chambers and as few as one intermediary chambers as shown in FIG. 2.

The use of a droplet generator 102a having multiple intermediary chambers 148a, 148b may be advantageous in some cases. For example, in some arrangements, the conditions in a single chamber design may not be able to be simultaneously optimized for the jet, droplet formation, and emission into the LPP chamber 110. For example, droplet formation may require a higher pressure than is allowed in the last intermediary chamber before the LPP chamber 110; a higher pressure would result in high flow or require a smaller aperture to limit that flow. The higher flow may result in increased target material (Xenon) pressure in the LPP chamber 110, reducing light transmission, and can also be expensive because of the high cost of Xenon. Merely using a smaller exit aperture may not always be feasible in terms of alignment. In some cases, using multiple intermediary chambers can improve the stability of the droplets in vacuum. By reducing overall gas flow (Xe plus other gases) from intermediary chamber to intermediary chamber and into the EUV chamber, the droplets may be less perturbed as they enter the next chamber(s). The number of chambers can be chosen such that the pressure drops result in gas flow between chambers that reduces, and in some cases eliminates, droplet perturbation.

Figure 4:
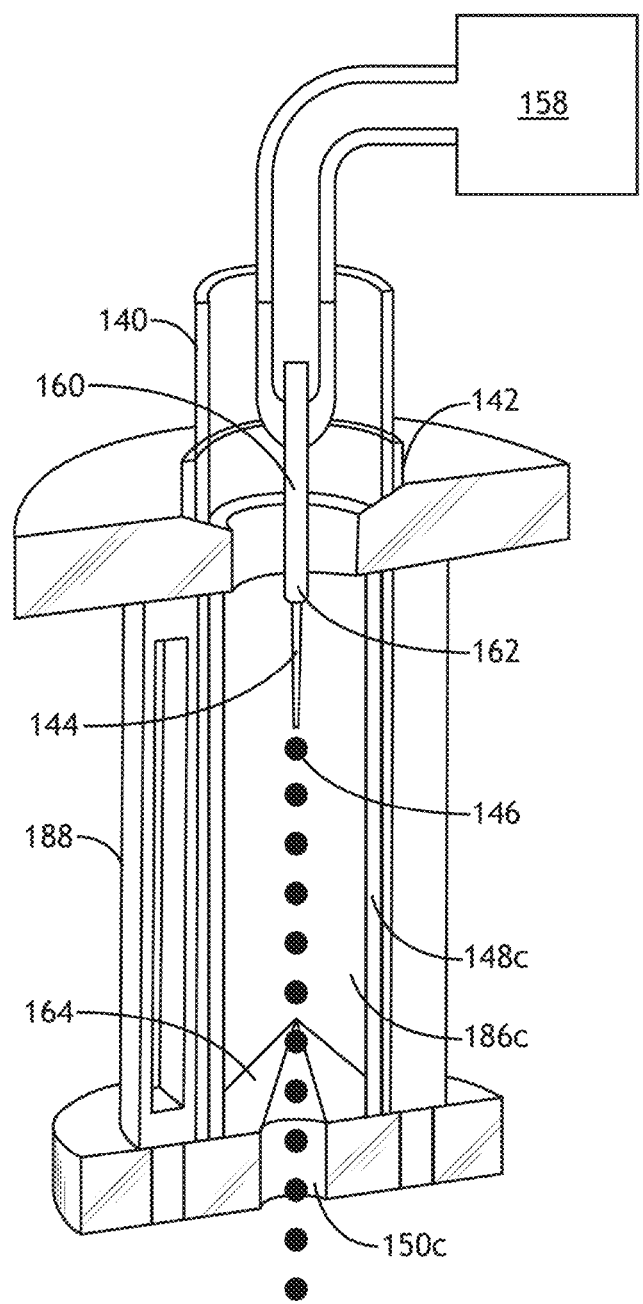
FIG. 4 is a perspective sectional view of a droplet generator illustrating the internal details of a jet generator, in accordance with one or more embodiments of the present disclosure.

FIG. 4 shows another example of a droplet generator 102b for use in the light source 100 shown in FIG. 1. As shown, the droplet generator 102b can include a jet generator 140 having a nozzle 142 dispensing a liquid target material as a jet 144 which subsequently breaks up into droplets 146 within an intermediary chamber 148c. As shown, the jet generator 140 includes a target material source 158 that feeds a constant supply of the liquid target material through a nozzle 142 that is formed as an elongated tube (e.g., capillary tube). A piezoelectric actuator 160 is positioned to surround the tube and modulates the flow velocity of target material through nozzle tip 162. This modulation controllably influences the breakup of jet 144 into droplets 146. Any modulation waveform known in the pertinent art can be used to drive the piezoelectric actuator 160. For example, a drive waveform designed to produce coalescing droplets can be used.

Also shown in FIG. 4, the intermediary chamber 148c can be formed with an exit aperture 150c to output target material for downstream irradiation in an LPP chamber. As shown, a frustoconical shell 164 can be positioned at the distal (i.e., downstream) end of intermediary chamber 148c. A more complete description of the frustoconical shell 164 is provided in U.S. patent application Ser. No. 14/180,107, titled "EUV Light Source Using Cryogenic Droplet Targets in Mask Inspection" by Bykanov et al., filed Feb. 13, 2014, the entire contents of which are hereby incorporated by reference herein. However, a frustoconical shell may not always be the optimal shape to terminate each intermediary chamber, because it may be desirable for the flow of gas from one intermediary chamber to another chamber to be laminar and low enough to maintain the proper pressure in the subsequent chamber.

Figure 5:
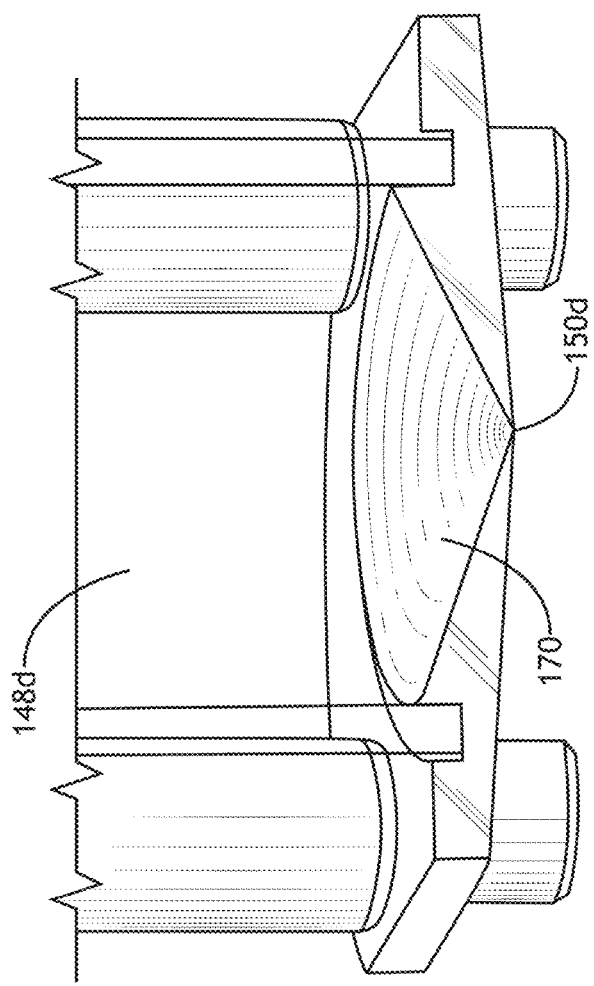
FIG. 5 is a perspective sectional view of the distal (downstream) portion of an intermediary chamber having a channel with an exit aperture at the distal end and a concave interior surface that extends from the proximal end of the channel, in accordance with one or more embodiments of the present disclosure.
Figure 6:
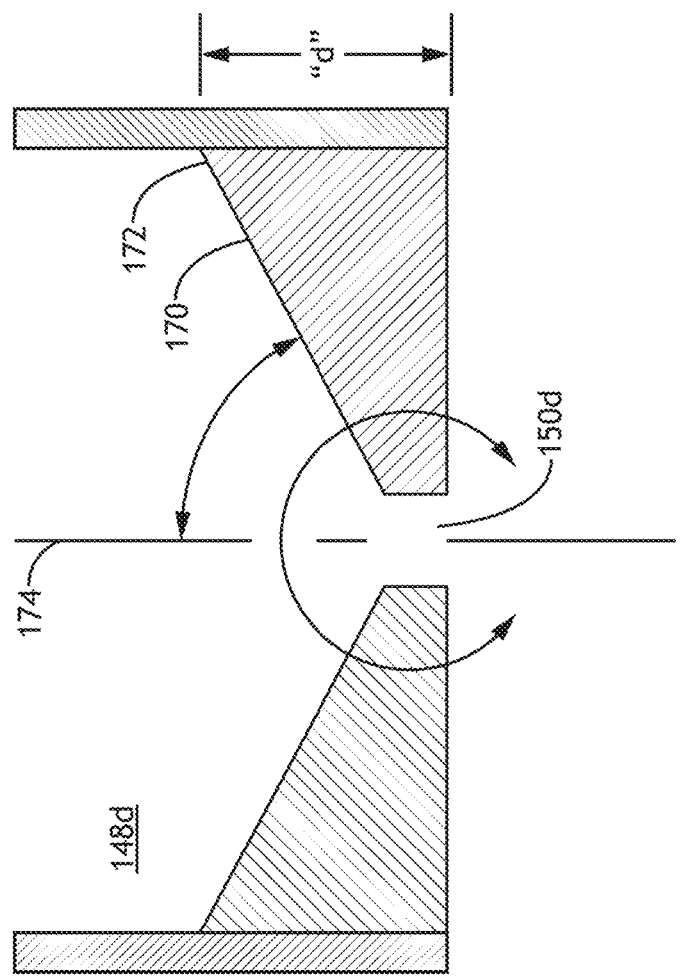
FIG. 6 is a sectional view of the intermediary chamber portion shown in FIG. 5 showing the length and angle of inclination of the concave interior surface, in accordance with one or more embodiments of the present disclosure.
Figure 7:
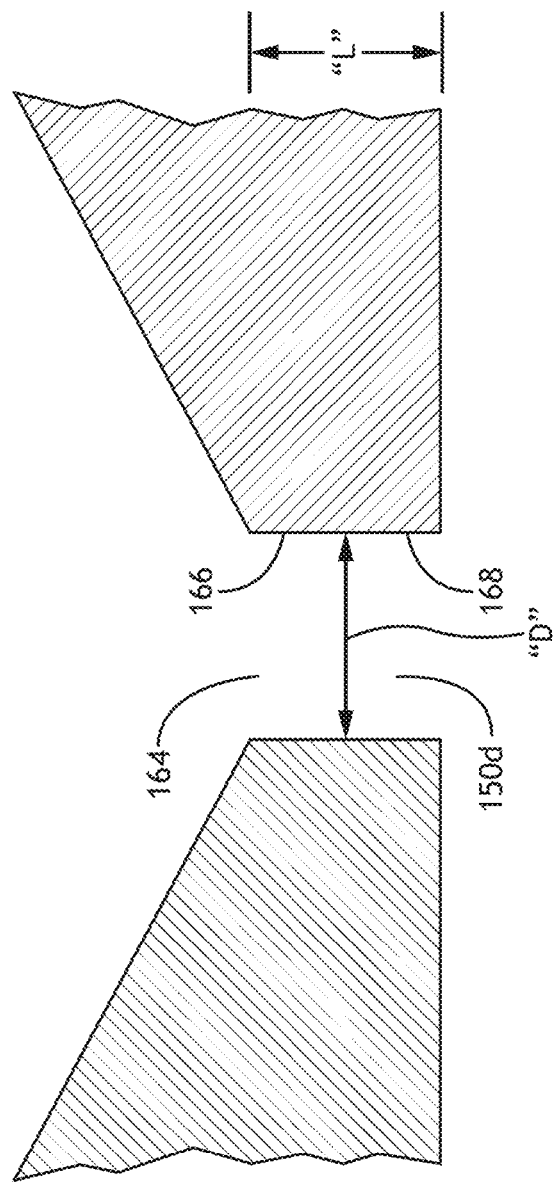
FIG. 7 is a detail, sectional view of a portion of the intermediary chamber enclosed within detail arrow 7-7 in FIG. 6 showing channel diameter and length, in accordance with one or more embodiments of the present disclosure.
Figure 8:
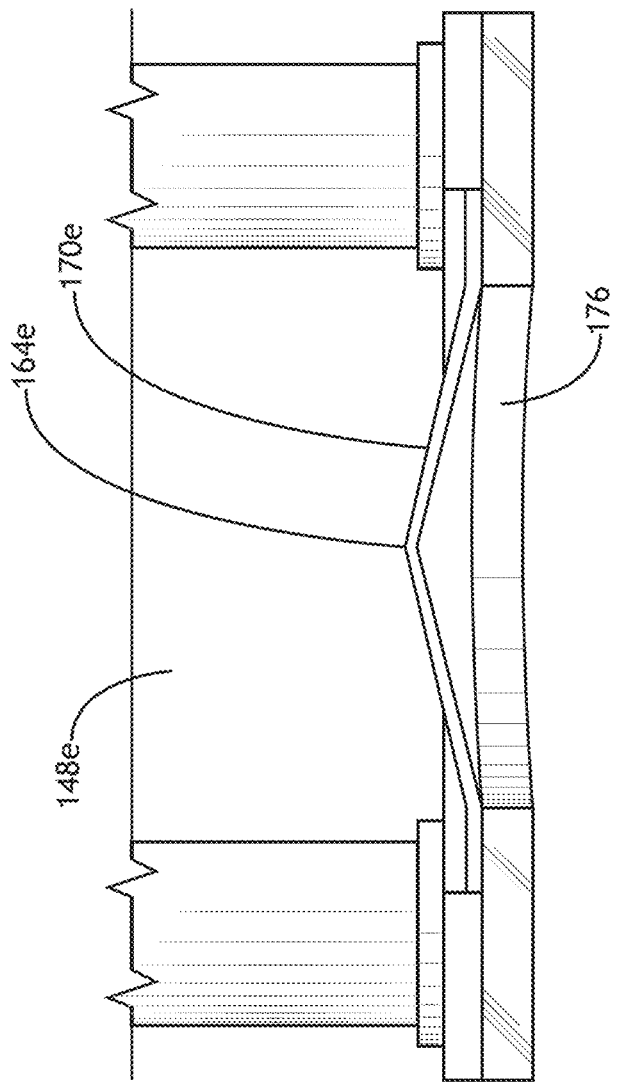
FIG. 8 is a perspective sectional view of the distal (downstream) portion of an intermediary chamber having a channel with an exit aperture at the distal end and a convex interior surface that extends from the proximal end of the channel and is formed by a constant thickness sheet, in accordance with one or more embodiments of the present disclosure.
Figure 9:
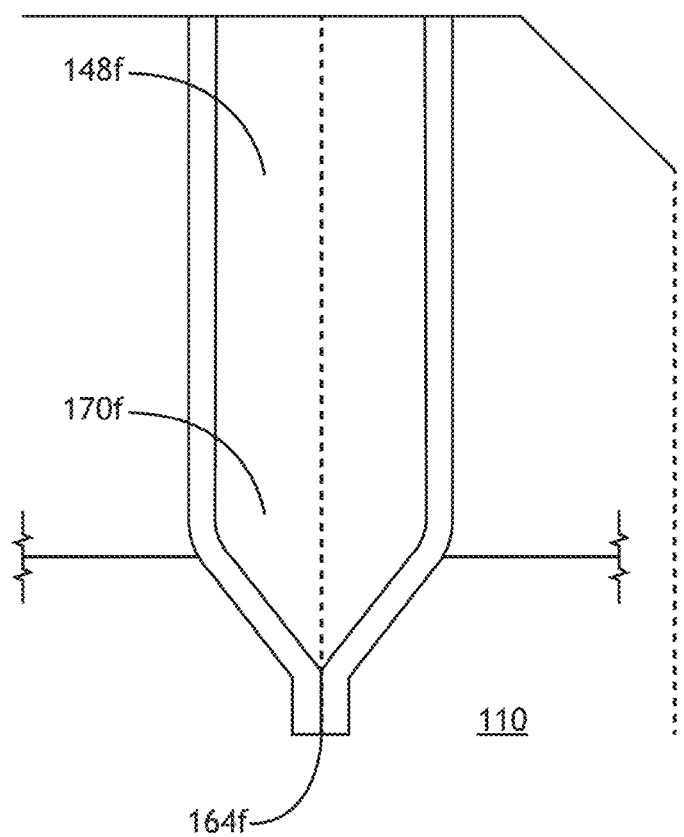
FIG. 9 is a perspective sectional view of an intermediary chamber having a channel with an exit aperture at the distal end and a gradually tapered interior surface that extends from the proximal end of the channel, in accordance with one or more embodiments of the present disclosure.
Figure 10:
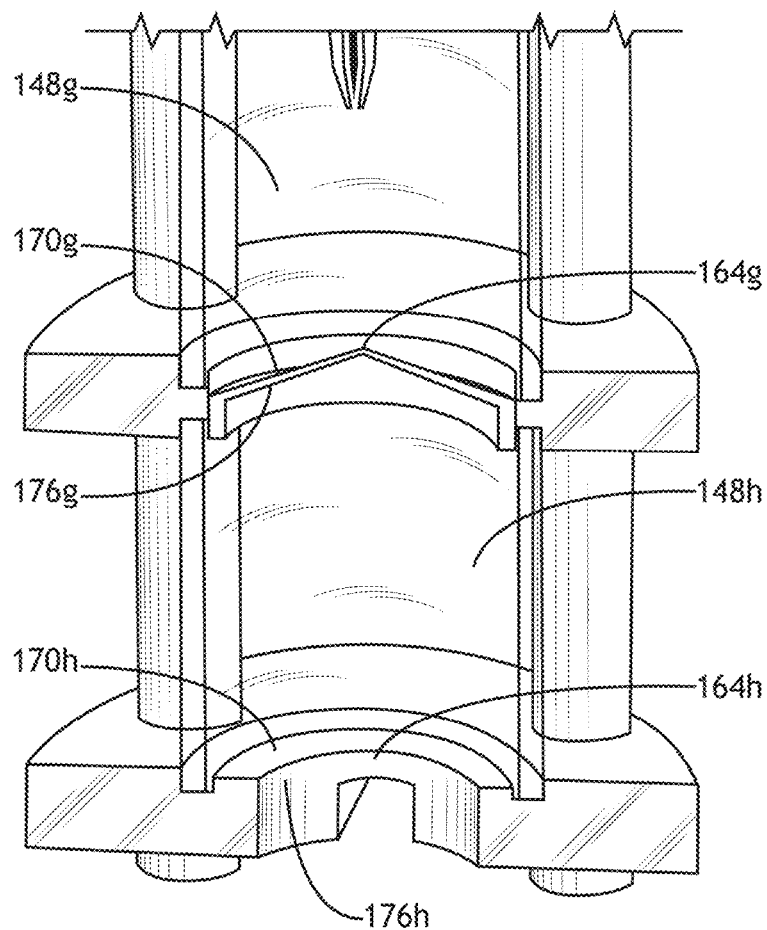
FIG. 10 is a perspective sectional view illustrating an intermediary chamber having a channel with an exit aperture at the distal end and a convex interior surface that extends from the proximal end of the channel and is formed by a sheet having a tapering thickness, in accordance with one or more embodiments of the present disclosure.

FIGS. 5-7 show a distal (i.e., downstream) portion of an intermediary chamber 148*d* having a channel 164 extending from a first end 166 to a second end 168 with the exit aperture 150*d* of the intermediary chamber 148*d* at the second end 168 of the channel 164. As shown, the intermediary chamber 148*d* has a concave internal surface 170 extending from the channel 164 at the first end 166. For the arrangement shown, the intermediary chamber 148*d* typically has a channel length, L, from the first end 166 to the second end 168 in the range of about 20 µm to 500 µm, an exit aperture diameter, D, in the range of 100 µm to 1000 µm. Also, for the arrangement shown, the concave internal surface 170 typically extends from the channel 164 at the first end 166 to an edge 172 positioned at an axial distance, d, from the exit aperture 150*d* in the range of about 2 mm to 10 mm and subtends an angle, a, between the internal surface 170 and the channel axis 174 that is greater than about 60 degrees.

As shown in FIG. 5, the component that establishes the exit aperture 150*d* and interior surface 170 can be a plate or plate assembly (sometimes referred to as a so-called 'skimmer') which is sealingly engaged with a wall of the intermediary chamber 148*d* (e.g., by an O-ring). The position of the plate may be adjustable (i.e., manually or by one or more actuators) to adjust the inclination of the channel 164 (e.g., relative to a droplet axis) or move the channel in a plane orthogonal to the droplet axis (e.g., for alignment purposes). More details regarding this adjustment can be found in U.S. patent application Ser. No. 14/180,107, titled "EUV Light Source Using Cryogenic Droplet Targets in Mask Inspection" by Bykanov et al., filed Feb. 13, 2014, the entire contents of which were previously incorporated by reference above.

FIG. 5 illustrates a simplified skimmer design that has minimal thickness with a concave profile. Specifically, the channel 164 for droplet propagation has been minimized so that any disturbances within the channel 164 are reduced or eliminated. The dimensions provided above have been chosen to optimize the amount of flow into the subsequent chamber(s) and the pressure gradient surrounding the exit aperture 150*d*. The intermediary chamber(s) can be terminated in a skimmer feature that allows the passage of the jet or droplet from moderate pressure to low pressure (needed for EUV generation) while limiting and shaping the gas flow, separating the environment of each chamber from the subsequent one and maintaining the stability of the droplets.

FIGS. 8-11 show the distal (i.e., downstream) portion of, respectively, intermediary chambers 148*e* (FIG. 8), 148*f* (FIG. 9), 148*g*, 148*h* (FIG. 10), 148*i*, 148*j*, 148*k* (FIG. 11), illustrating several embodiments having different internal surface shapes. More specifically, intermediary chamber 148*e* shown in FIG. 8 has a convex internal surface 170*e* extending from the channel 164*e* formed from a constant thickness sheet 176. Intermediary chamber 148*f* shown in FIG. 9 has a smooth, gradually tapering internal surface 170*f* extending from the channel 164*f*. This shape (sometimes referred to as a so-called "sluice design") can reduce turbulence in gas passing from the intermediary chamber 148*f* into a subsequent chamber such as the LPP chamber 110. This design is intended to create a laminar flow of the surrounding gas as it enters and exits the channel 164*f*. The pressure gradient within the channel 164*f* can, in some cases, be tuned, by varying the length, diameter, and inlet and outlet pressure, to induce a self-centering effect on the droplets. Intermediary chambers 148*g* and 148*h* shown in FIG. 10 have convex internal surfaces 170*g* and 170*h* extending from respective channels 164*g* and 164*h*, formed from tapering sheets 176*g* and 176*h*. Intermediary chambers 148*i*, 148*j*, and 148*k* shown in FIG. 11 (see also FIGS. 12-14) have flat, planar, internal surfaces 170*i*, 170*j* and 170*k* extending from respective channels 164*i*, 164*j* and 164*k*. FIGS. 8-11 show intermediary chambers having cylindrical shaped channels. Channels having other shapes may be used. More details regarding various channel shapes and their effect on droplets and gasses passing through the channels can be found in U.S. patent application Ser. No. 14/180,107, titled "EUV Light Source Using Cryogenic Droplet Targets in Mask Inspection" by Bykanov et al., filed Feb. 13, 2014, the entire contents of which were previously incorporated by reference above. Also, skimmer modules can be employed that either extended into, out of, or both, relative to the intermediary chamber it terminates.

Figure 11:
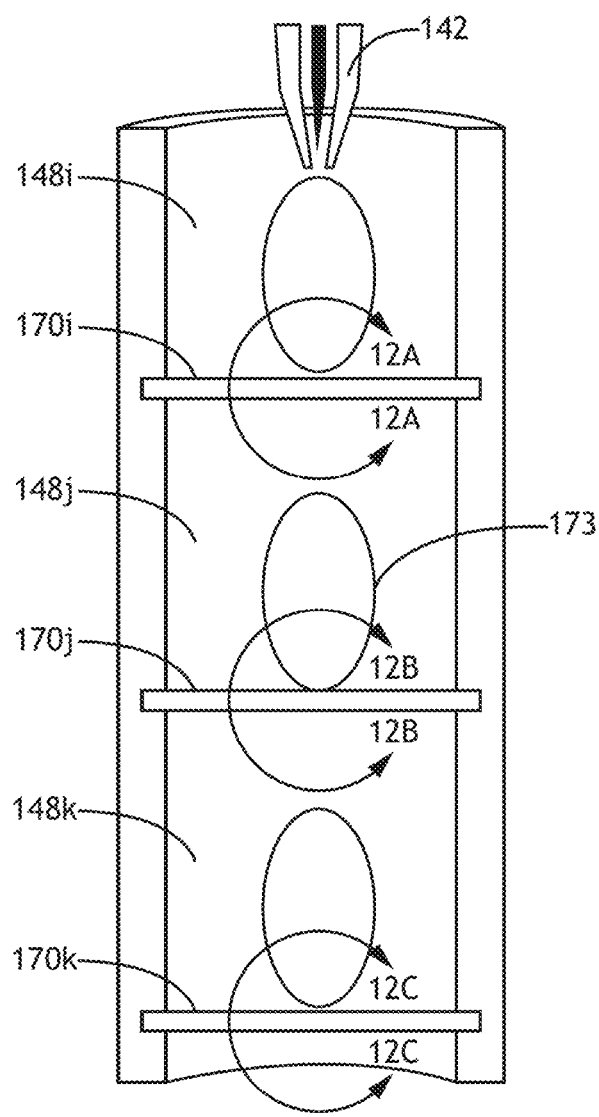
FIG. 11 is a perspective sectional view of a droplet generator having multiple intermediary chambers which establish an aerodynamic lens, in accordance with one or more embodiments of the present disclosure.
Figure 12A:
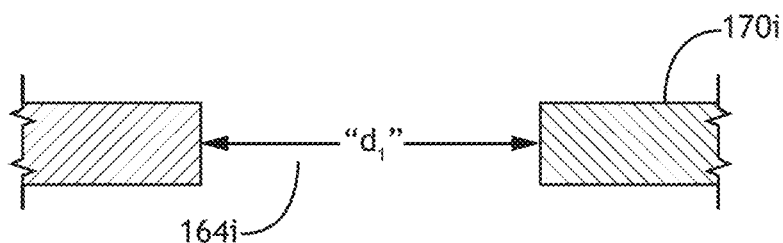
FIG. 12A is a detailed, sectional view of a portion of the intermediary chambers enclosed within detail arrow 12A-12A in FIG. 11, showing channel diameter for each of the intermediary chambers shown in FIG. 11, in accordance with one or more embodiments of the present disclosure.
Figure 12B:
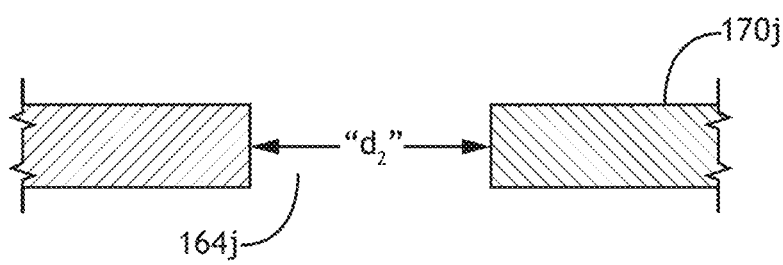
FIG. 12B is a detailed, sectional view of a portion of the intermediary chambers enclosed within detail arrow 12B-12B in FIG. 11, showing channel diameter for each of the intermediary chambers shown in FIG. 11, in accordance with one or more embodiments of the present disclosure.
Figure 12C:
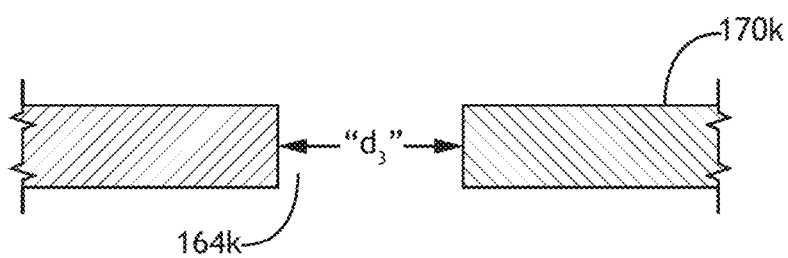
FIG. 12C is a detailed, sectional view of a portion of the intermediary chambers enclosed within detail arrow 12C-12C in FIG. 11, showing channel diameter for each of the intermediary chambers shown in FIG. 11, in accordance with one or more embodiments of the present disclosure.

FIGS. 11, 12A, 12B and 12C illustrate the use of multiple intermediary chambers 148*i*, 148*j*, 148*k* to establish an aerodynamic lens to direct droplets toward an irradiation site 108 (see FIG. 1). Specifically, the series of exit apertures 150*i*, 150*j*, 150*k* can be constructed in order to create an aerodynamic lens that actively focuses the droplets within each chamber. To establish an aerodynamic lens, as shown, the exit apertures of the intermediary chambers decrease in a direction downstream of the nozzle 142. More specifically, exit aperture 150*i* has a diameter, $d_1$, exit aperture 150*j* has a diameter, $d_2$, and exit aperture 150*k* has a diameter, $d_3$, with $d_1 > d_2 > d_3$. FIG. 11 shows that a window(s) 173 can be provided between each pair of exit apertures for alignment and diagnostic purposes whereby a camera (not shown) can view the droplets in bright field illumination or as a shadowgram.

It is to be appreciated that a droplet generator may use different types of skimmers (i.e., one could be convex, another concave). Also, the channel dimensions and/or internal surface dimensions may vary from one intermediary chamber to the next.

Figure 13:
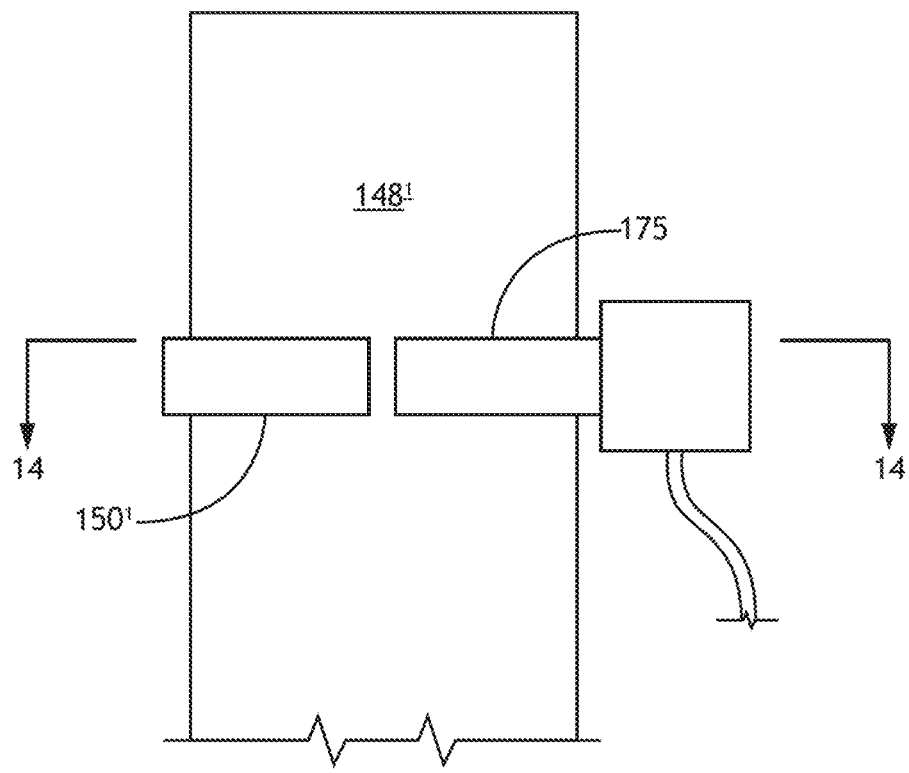
FIG. 13 is a simplified, sectional view of a portion of a droplet generator having an exit aperture of an intermediary chamber that is formed with a motorized iris assembly, in accordance with one or more embodiments of the present disclosure.
Figure 14:
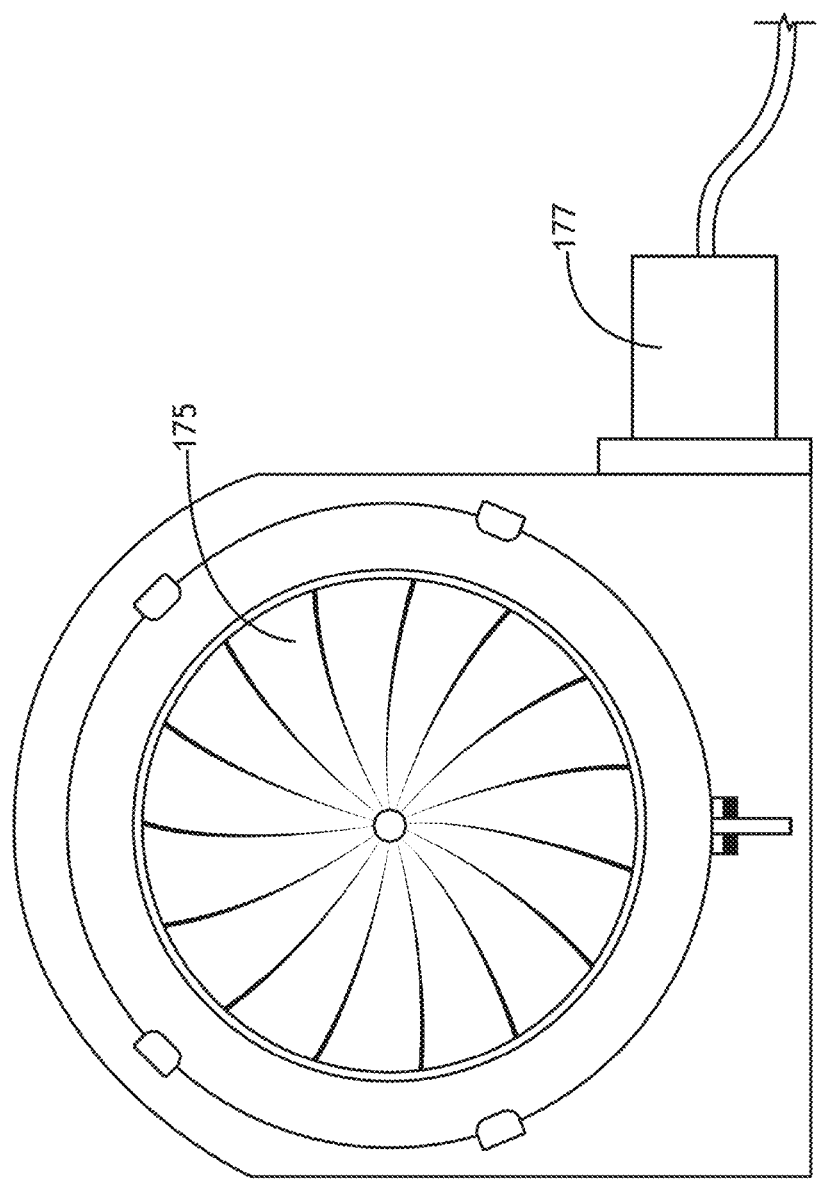
FIG. 14 is a sectional view as seen along line 14-14 in FIG. 13 showing the motorized iris assembly, in accordance with one or more embodiments of the present disclosure.

FIGS. 13 and 14 illustrate an intermediary chamber $148^1$ having an exit aperture $150^1$ that is formed with a motorized iris assembly having an iris assembly 175 and motor 177 which can be, for example, in communication with the control system 120 (see FIG. 1). With this arrangement, the effective diameter of the exit aperture $150^1$ can be adjustably controlled. This arrangement can be used to establish the exit aperture of an aerodynamic lens (see FIG. 11) and, in some cases, can be used to actively maintain droplet stability. With this arrangement, the exit aperture diameter can be enlarged for alignment purposes in addition to being adjusted to provide optimal conditions of pressure and flow along the droplet path.

Referring back to FIG. 2, it can be seen that the droplet generator 102 having a single intermediary chamber 148 can include an environmental control system 152 for controlling one or more of gas composition, gas temperature and gas pressure in the intermediary chamber 148. In addition, FIG. 3 shows that droplet generator 102*a* having multiple intermediary chambers 148*a*, 148*b* can include environmental control systems 152*a*, 152*b* for controlling one or more of gas composition, gas temperature and gas pressure in each respective intermediary chamber 148*a*, 148*b*.

Figure 15:
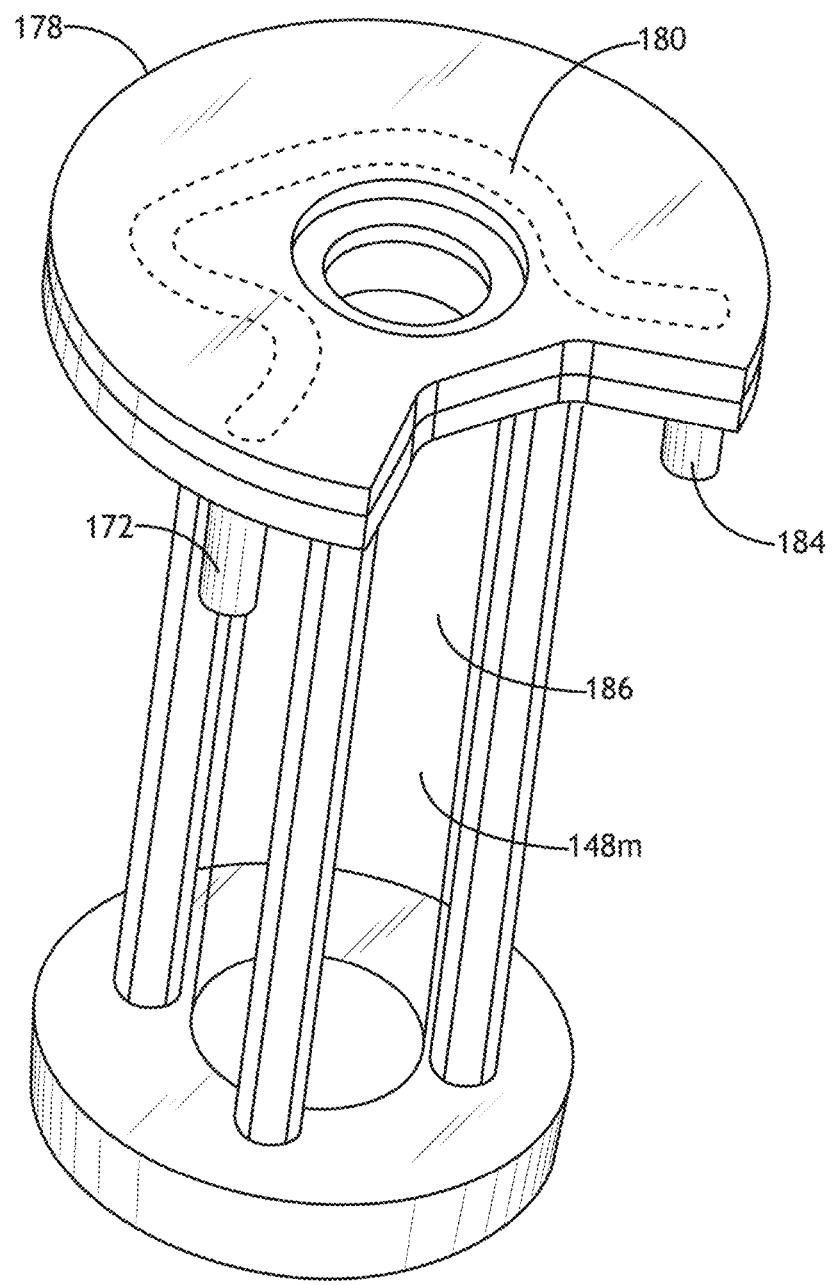
FIG. 15 is a perspective view of an intermediary chamber having an environmental control system for controlling gas temperature consisting of a plate having a passageway for passing a heat transfer fluid, in accordance with one or more embodiments of the present disclosure.

FIG. 15 illustrates an environmental control system for controlling gas temperature for an intermediary chamber 148*m* having a plate 178 positioned in contact with the intermediary chamber 148*m*. As shown, the plate 178 can be formed with an internal fluid passageway 180 having an inlet 182 and outlet 184 for passing a heat transfer fluid through the plate 178. The plate 178 can be placed in contact with a wall 186 of the intermediary chamber 148*m*, which may, for example, be made of a thermally conductive material such as metal. A heat exchange fluid may be passed through the plate 178 to heat or cool the gas within the intermediary chamber 148*m*, for example, under the control of the control system 120 (see FIG. 1). Alternatively, the temperature control plate may form a portion of the intermediary chamber (i.e., a passageway for passing a heat exchange fluid may be formed in one of the walls or structures establishing the intermediary chamber).

Control of the temperature of the gas surrounding the target material, in combination with pressure control (see below), can be used to control the rate of evaporation of the target material. The temperature could be adjusted by controlling the temperature of the surrounding chamber material, inserted thermal elements, or by controlling the temperature of the injected gas. FIG. 15 shows thermal regulation channels within the end plates of a droplet chamber which can be held at the same or different temperatures. A process fluid, for example, a coolant, can be pumped through the channels to achieve the desired temperature. A thermocouple or similar device could be used to monitor the actual temperature of the plates and other components. Peltier elements could be added to or replace the cooling channels to regulate the temperature. They could be used to apply or remove heat as needed, particularly in areas where channels may not be possible. The temperature of the gas surrounding the droplets could be set to minimize the evaporation rate of the target material or accelerate it as desired by ranging between about 160K and 300K. Adjacent chambers could be held at different temperatures by controlling the amount of gas flow between them, as well as having insulation barriers in the system.

Referring back to FIG. 4 it can be seen that an environmental control system for controlling gas temperature for an intermediary chamber 148*c* can include one or more fin(s) 188 positioned outside intermediary chamber 148*c*. For example, the fin(s) 188 can be positioned in contact with the intermediary chamber 148*c*, such as a wall 186*c* or some other portion of the intermediary chamber 148*c*, which may, for example, be made of a thermally conductive material such as metal. Alternatively, one or more fin(s) may be positioned within an intermediary chamber to control gas temperature. These fins may be heated or cooled via pumped fluid, Peltier elements, or other similar devices.

Figure 16:
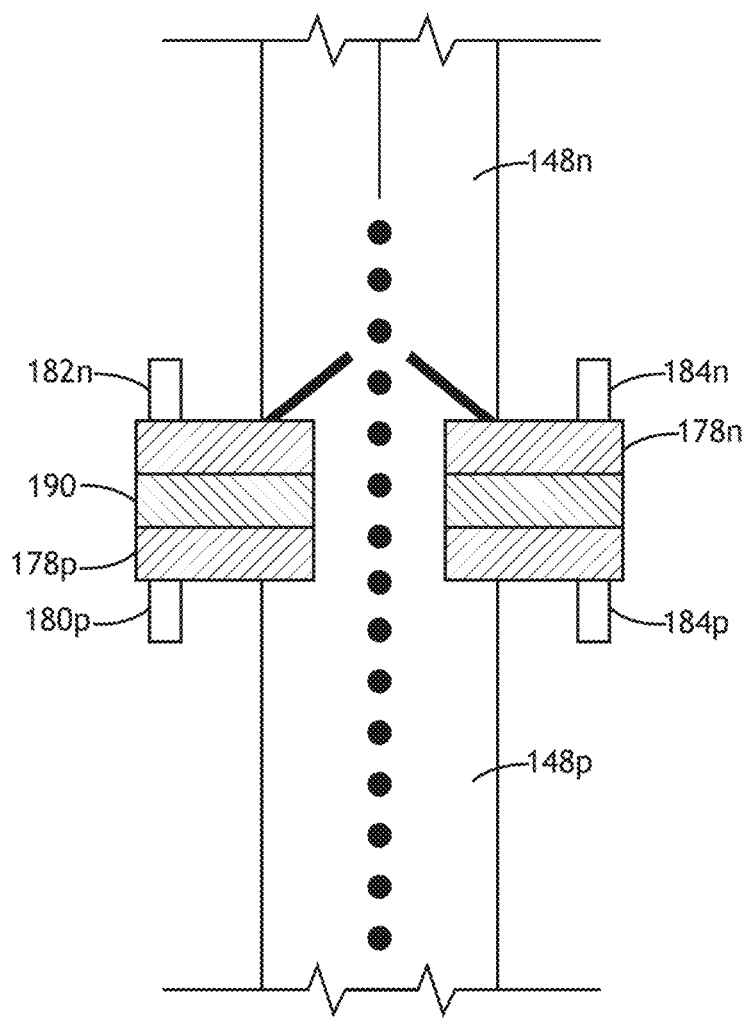
FIG. 16 is a sectional view showing two intermediary chambers, each having an environmental control system for controlling gas temperature consisting of a plate having a passageway for passing a heat transfer fluid and an insulator plate separating the two intermediary chambers, in accordance with one or more embodiments of the present disclosure.

FIG. 16 illustrates environmental control systems for controlling gas temperature for intermediary chambers 148*n* and 148*p* having a plate 178*n* positioned in contact with the intermediary chamber 148*n*. The plate 178*n* can be formed with an internal fluid passageway having an inlet 182*n* and outlet 184*n* for passing a heat transfer fluid through the plate 178*n*. Also, a plate 178*p* is positioned in contact with the intermediary chamber 148*p*. The plate 178*p* can be formed with an internal fluid passageway having an inlet 182*p* and outlet 184*p* for passing a heat transfer fluid through the plate 178*p*. FIG. 16 further shows that the plate 178*n* and intermediary chamber 148*n* can be thermally isolated from plate 178*p* and intermediary chamber 148*p* by an insulating plate 190, allowing independent control of the gas temperature in each of the intermediary chambers 148*n*, 148*p*.

Figure 17:
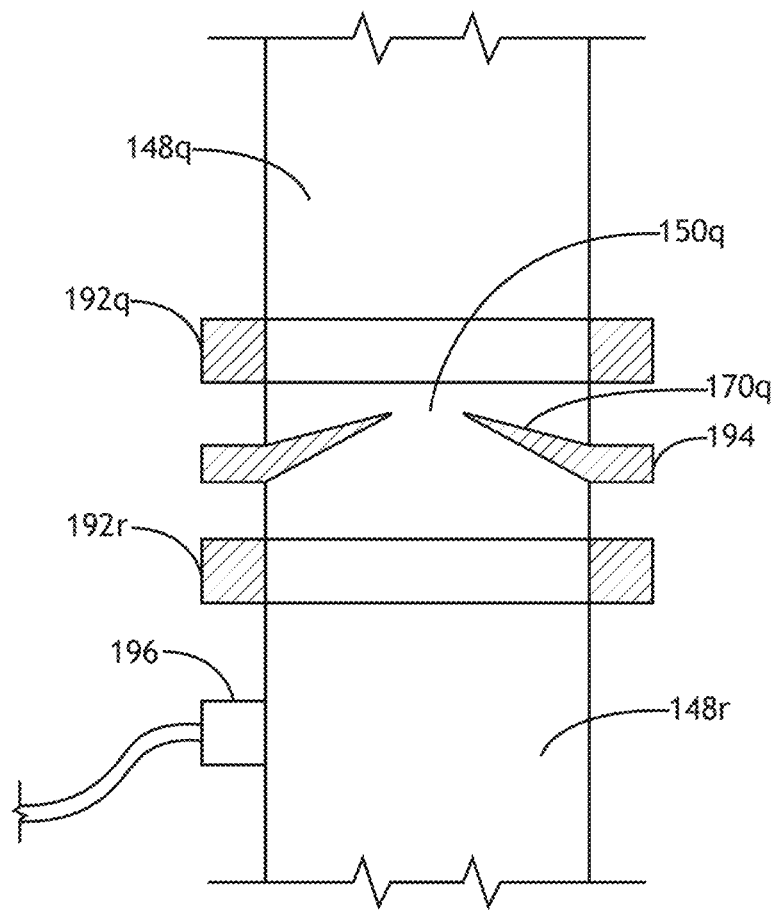
FIG. 17 is a sectional view showing two intermediary chambers, each having an environmental control system for controlling gas temperature consisting of a temperature control clamshell and an insulator plate which establishes the exit aperture of the first intermediary chamber and thermally isolates the two intermediary chambers from each other, in accordance with one or more embodiments of the present disclosure.

FIG. 17 illustrates environmental control systems for controlling gas temperature for intermediary chambers 148*q* and 148*r* having a temperature control clamshell 192*q* that is attachable to the wall of intermediary chamber 148*q* and a temperature control clamshell 192*r* that is attachable to the wall of intermediary chamber 148*r*. FIG. 17 further shows that the temperature control clamshell 192*q* and intermediary chamber 148*q* can be thermally isolated from the temperature control clamshell 192*r* and intermediary chamber 148*r* by an insulating plate 194 (e.g., made of a thermally insulating material) that also forms the internal surface 170*q* and the exit aperture 150*q* for the intermediary chamber 148*q*, allowing independent control of the gas temperature in each of the intermediary chambers 148*q*, 148*r*. FIG. 17 also illustrates that a Peltier cooling element 196 can be attached to (or positioned within) intermediary chamber 148*r* to control gas temperature.

Figure 18:
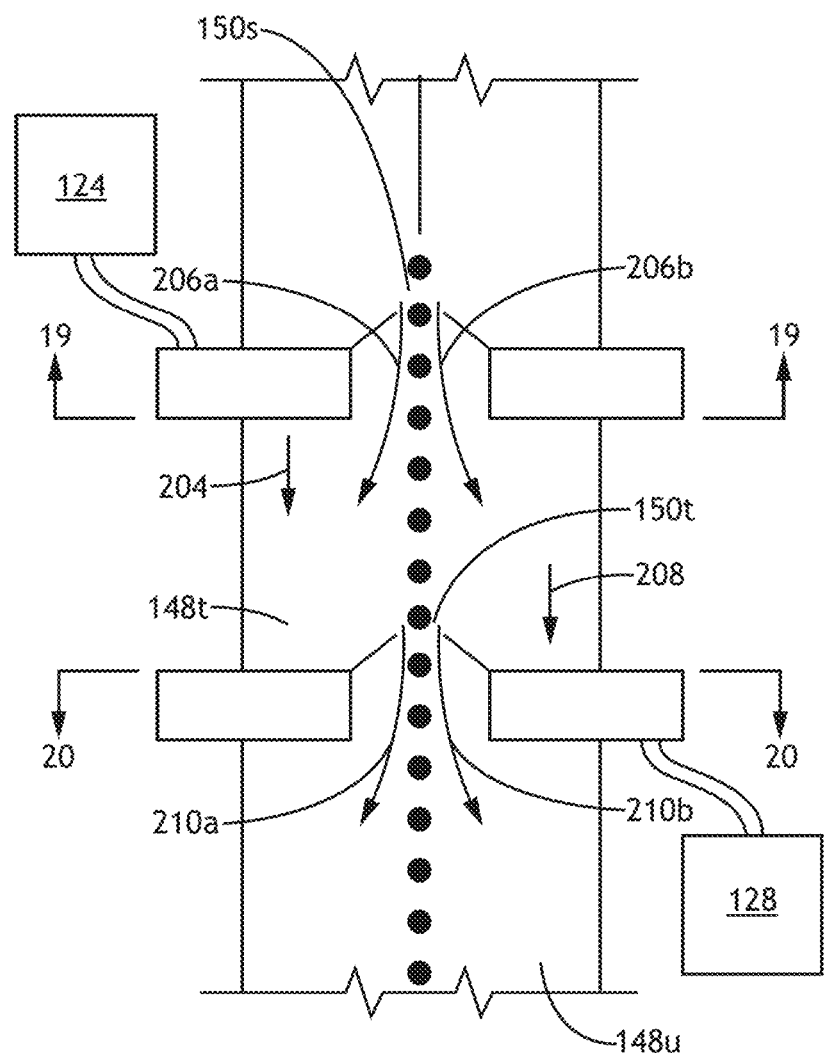
FIG. 18 is a sectional view of a plurality of intermediary chambers showing an environmental control system for controlling gas pressure and/or gas composition for one of the intermediary chambers, in accordance with one or more embodiments of the present disclosure.
Figure 19:
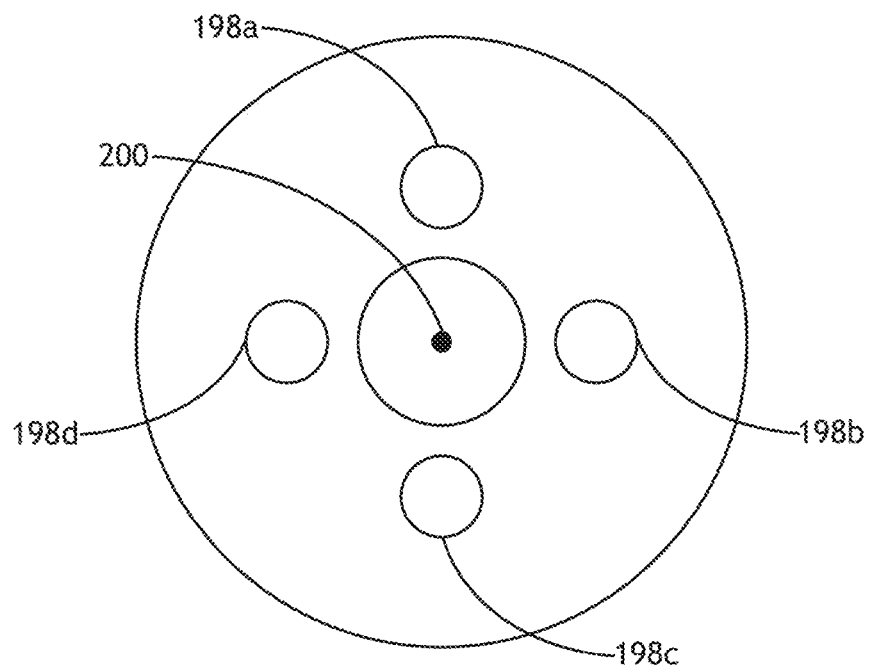
FIG. 19 is a sectional view as seen along line 19-19 in FIG. 18 showing a symmetrical arrangement of ports for introducing gas into an intermediary chamber, in accordance with one or more embodiments of the present disclosure.
Figure 20:
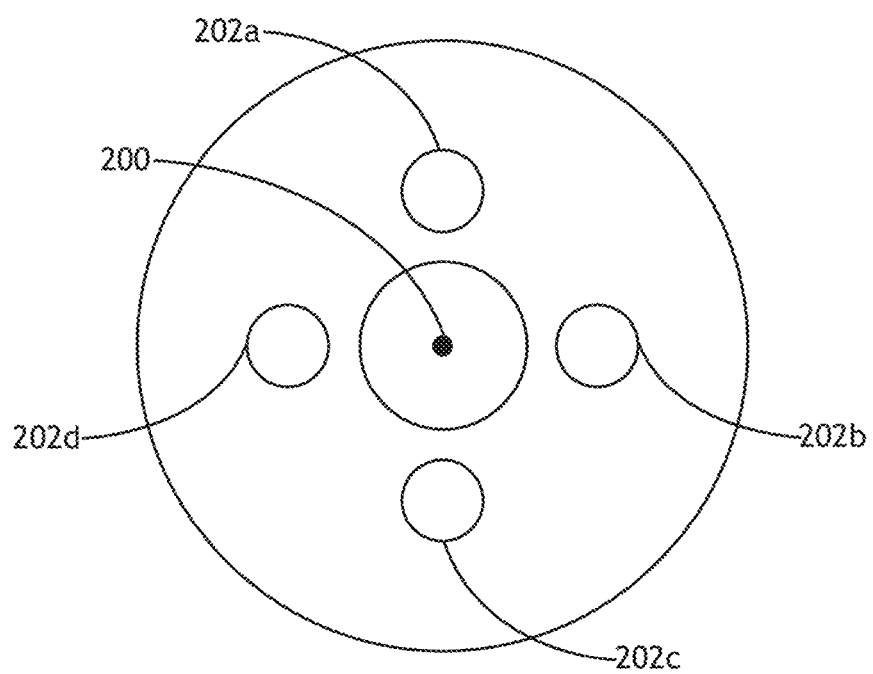
FIG. 20 is a section view as seen along line 20-20 in FIG. 18 showing a symmetrical arrangement of ports for removing gas from an intermediary chamber, in accordance with one or more embodiments of the present disclosure.

FIGS. 18-20 illustrate an environmental control system for controlling gas pressure and/or gas composition within an intermediary chamber 148*t*. As shown, the environmental control system includes a gas supply system 124 for introducing a measured flow of gas into the intermediary chamber 148*t* and a vacuum system 128 for removing a measured flow of gas from the intermediary chamber 148*t*. As indicated above with reference to FIG. 1, both the gas supply system 124 and vacuum system 128 are in communication with the control system 120. FIG. 19 illustrates that the measured flow of gas from the gas supply system 124 can be introduced through symmetrically positioned ports 198*a*-*d* (i.e., ports 198*a*-*d* can be equally spaced around the droplet axis 200). Similarly, FIG. 20 illustrates that the measured flow of gas removed by the vacuum system 128 can be removed through symmetrically positioned ports 202*a*-*d* (i.e., ports 202*a*-*d* can be equally spaced around the droplet axis 200).

As shown in FIG. 18, gas inputs to intermediary chamber 148*t* include flows from gas supply system 124 (represented by arrow 204) and flows through exit aperture 150*s* from intermediary chamber 148*s* (represented by arrows 206*a*, 206*b*).

Gas outputs from intermediary chamber 148*t* include flows to vacuum system 128 (represented by arrow 208) and flows through exit aperture 150*t* to intermediary chamber 148*u* (represented by arrows 210*a*, 210*b*).

In one implementation, the flow rate and composition from gas supply system 124 and flow rate to vacuum system 128 can be measured and flows through exit aperture 150*s* and exit aperture 150*t* can be calculated. These data can then be used to adjust the gas supply system 124 flow rate and vacuum system 128 flow rate to control gas pressure and/or gas composition within intermediary chamber 148*t*.

Each intermediary chamber 148*s*, 148*t* can have its own pressure, temperature, and gas composition control. These parameters can be optimized to improve the stability of the system within each intermediary chamber by controlling, in particular, the evaporation rate of the target material and the gas flow between each chamber. Pressure in the jet area may be held between about 75 and 750 Torr. Pressure drops into subsequent chambers can be on the order of a factor of two or less to keep gas expansion subsonic, and the gas flow laminar, where the system may be sensitive to a large pressure gradient, such as the final entry into the LPP chamber. At locations along the target path that are less sensitive the pressure drop may be higher. The pressure within each chamber is adjusted by controlling the injection and pumping rates of gas within each chamber. For example, gas may be injected symmetrically at the proximal end of a chamber and subsequently pumped, along with any evaporation of the liquid or solid, symmetrically at the distal end of each chamber. Different gases, such as Xenon, Argon, Helium, or Hydrogen, may also be injected into each chamber with varying concentration. Thus the flow of each gas, typically between 5 and 1000 sccm, controls its concentration within the chamber. The total flow of all the gases may also be between 5 and 1000 sccm with either homogeneous or heterogeneous composition. A multi-chambered droplet delivery system can allow for proper optimization of the temperature, pressure, and gas composition at various key locations along the jet and droplet path. The pressure within each section can be controlled via cylindrically symmetric pumping or introduction of gas, including the flow through any proximal or distal exit apertures in each chamber. The temperature of each section may be controlled individually as well. Additionally, each section may have a different gas composition, controlling concentration similar to the way pressure is controlled. Controlling these conditions can allow one to optimize the following other properties: jet formation and stability, droplet formation and initial stability, and the active or passive maintenance of droplet stability into the LPP chamber.

The pressure and temperature in the intermediary chamber immediately downstream of the jet generator may be held at or near the triple point of the target material. As an example, the triple point for Xenon is approximately 161.4 degrees K and 612 Torr. However, in some cases, greater droplet stability may be obtained by maintaining the gas temperature and gas pressure in the intermediary chamber immediately downstream of the jet generator at a pressure/temperature that is not at or near the triple point of the target material. The length of the intermediary chamber immediately downstream of the jet generator can be chosen so that it is just long enough for droplet formation, which is generally less than about 1 cm.

In addition, as indicated above, the optimization of each skimmer's geometry can minimize the disturbance of the jet and droplets as they pass from one chamber to the next. The skimmers may be pre-aligned or have an actuator to align them to the droplet stream. In some cases, removal of gas only through the skimmer's exit aperture can decrease the droplet stability, and also increase the demand for pumping in the LPP chamber or require a reduction in the amount of light available from the EUV light source.

Figure 21:
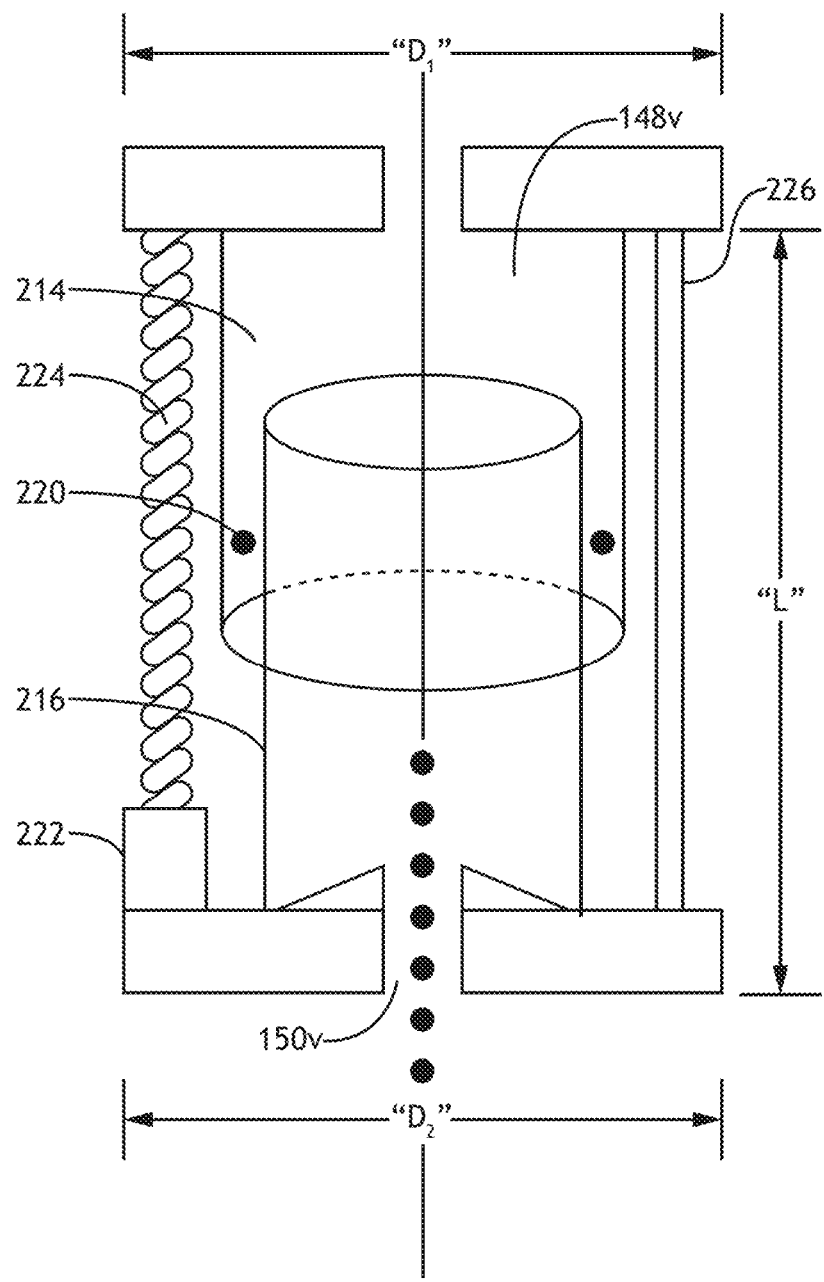
FIG. 21 is a sectional view of a first embodiment of an intermediary chamber having an adjustable length, in accordance with one or more embodiments of the present disclosure.

FIG. 21 shows an assembly for establishing an intermediary chamber 148v and adjusting a length, L, of the intermediary chamber 148v while the intermediary chamber 148v is maintained in a pressurized state. As shown, the intermediary chamber 148v receives target material at a chamber input location 212 and has an exit aperture 150v to output target material and defines a length, L, between the input location 212 and exit aperture 150v. The assembly shown can be employed in a single intermediary chamber device (see FIG. 2) or a multiple intermediary chamber device (i.e., having two or more intermediary chambers (see FIG. 3)). FIG. 21 further shows that the assembly includes a first component 214 having a cylindrical wall of inner diameter, $D_1$ and a second component 216 having a cylindrical wall of outer diameter, $D_2$, with $D_1 > D_2$. As shown, the cylindrical walls can be arranged concentrically about an axis 218 and a seal 220 can be positioned between the cylindrical wall of the first component 214 and the cylindrical wall of the second component 216. It can also be seen that the assembly includes a motor 222, e.g. stepper motor, linear actuator or other drive system, rotating a screw 224 to move one of the components 214, 216 relative to the other, along the axis 218 to vary the length, L. One or more axial supports 226 can be provided, as shown to ensure the plates remain parallel during axial translation.

Each of the two concentric cylinders can have a fixed seal on one end (i.e., one has a proximal seal, the other a distal seal to the upper and lower plate, respectively). This seal could be an adhesive, braze, or weld. Alternatively, the cylinders could be attached via adhesive, braze or weld to a sealing plate that contains a seal such as an o-ring. The o-ring could be an elastomer, energized Teflon, or a metal seal and may be seated within a groove. This seal allows the volume contained within the two cylinders to be maintained at a higher pressure than the outer chamber. Additionally, a plate formed with an exit aperture or other features could be brazed at one end of a cylinder. The cylinders could be made of a transparent material, including but not limited to sapphire. Additionally, if the cylinders themselves are not transparent, windows could be placed along the cylinders' lengths to allow for alignment and diagnostics.

Figure 22:
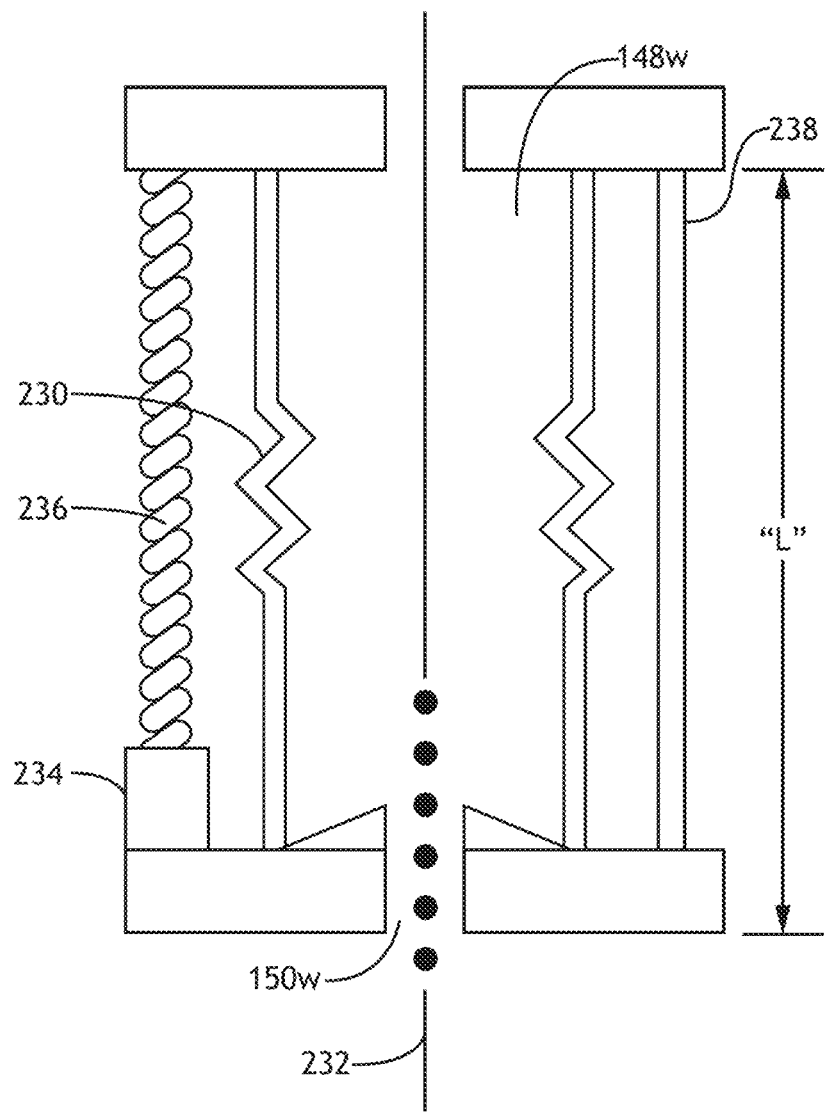
FIG. 22 is a sectional view of another embodiment of an intermediary chamber having an adjustable length, in accordance with one or more embodiments of the present disclosure.

FIG. 22 shows another assembly for establishing an intermediary chamber 148w and adjusting a length, L, of the intermediary chamber 148w while the intermediary chamber 148w is maintained in a pressurized state. As shown, the intermediary chamber 148w receives target material at a chamber input location 228 and has an exit aperture 150w to output target material and defines a length, L, between the input location 228 and exit aperture 150w. The assembly shown can be employed in a single intermediary chamber device (see FIG. 2) or a multiple intermediary chamber device (i.e. having two or more intermediary chambers (see FIG. 3)). FIG. 22 further shows that the assembly includes a bellows 230 aligned along an axis 232 that can be axially expanded and contracted to vary the length, L. It can also be seen that the assembly includes a motor 234 rotating a screw 236 to expand/contract the bellows 230 and vary the length, L. One or more axial supports 238 can be provided, as shown.

The assemblies shown in FIGS. 21 and 22 can be used, for example, to vary the length, L, such that a jet breaks up into droplets within an intermediary chamber. As indicated above, this adjustment can be made while an environment (i.e., pressure, temperature and/or composition) is maintained in the intermediary chamber. For example, this capability may be useful after nozzle replacement or some other change which may affect the location where the jet breaks up into droplets. For example, the jet decay length may change as the piezoelectric transducer frequency is changed, which may be necessary if the droplet frequency needs to be adjusted to match the drive laser frequency or if the plasma radiation frequency needs to be tuned to match some external process. The adjustable length intermediary chamber described herein could, for example, allow for the tuning of the chamber length to obtain an optimal length that matches the jet's particular decay length, droplet combination length, or other critical length along the droplet delivery system.

The bellows 230 can be terminated in a transparent section, brazed glass or sapphire, for example, or have transparent windows, for alignment and diagnostic purposes. This motorization can be employed in the aerodynamic lens assembly (see FIG. 11 and corresponding description) as well to adjust the distance between various apertures to optimize that lens system. Also, the adjustment of intermediary chamber length can enable a system to be flexible when adjusting to different parameters (pressure, temperature, gas composition, etc.) or adjusting to external changes such as drive-laser frequency or desired LPP frequency.

Figure 23:
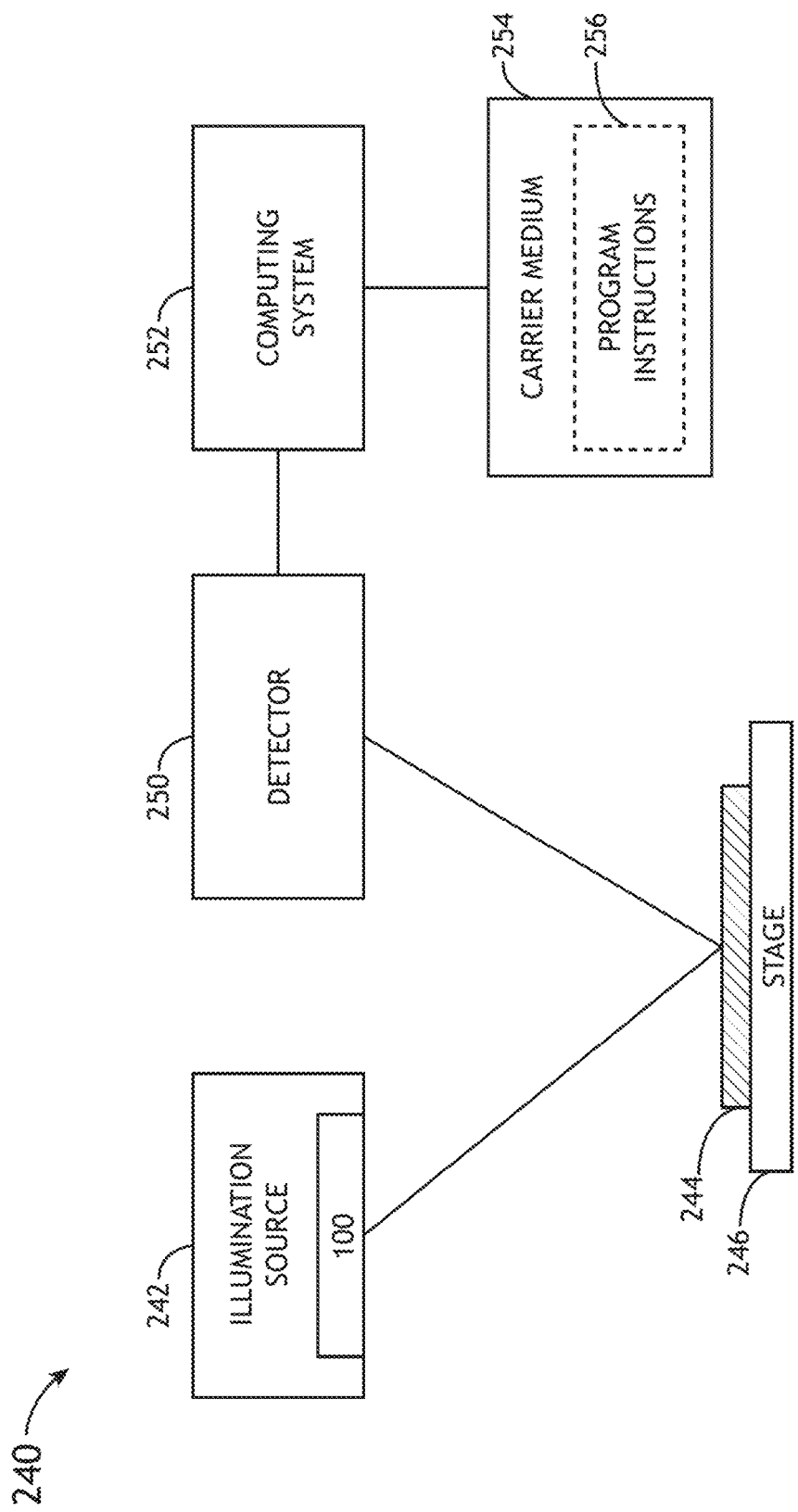
FIG. 23 is a simplified schematic diagram illustrating an inspection system incorporating a light source, in accordance with one or more embodiments of the present disclosure.

EUV illumination may be used for semiconductor process applications, such as inspection, photolithography, or metrology. For example, as shown in FIG. 23, an inspection system 240 may include an illumination source 242 incorporating a light source, such as a light source 100 described above having one of the droplet generators described herein. The inspection system 240 may further include a stage 246 configured to support at least one sample 244, such as a semiconductor wafer or a blank or patterned mask. The illumination source 242 may be configured to illuminate the sample 244 via an illumination path, and illumination that is reflected, scattered, or radiated from the sample 244 may be directed along an imaging path to at least one detector 250 (e.g., camera or array of photo-sensors). A computing system 252 that is communicatively coupled to the detector 250 may be configured to process signals associated with the detected illumination signals to locate and/or measure various attributes of one or more defects of the sample 244 according to an inspection algorithm embedded in program instructions 256 executable by a processor of the computing system 252 from a non-transitory carrier medium 254.

Figure 24:
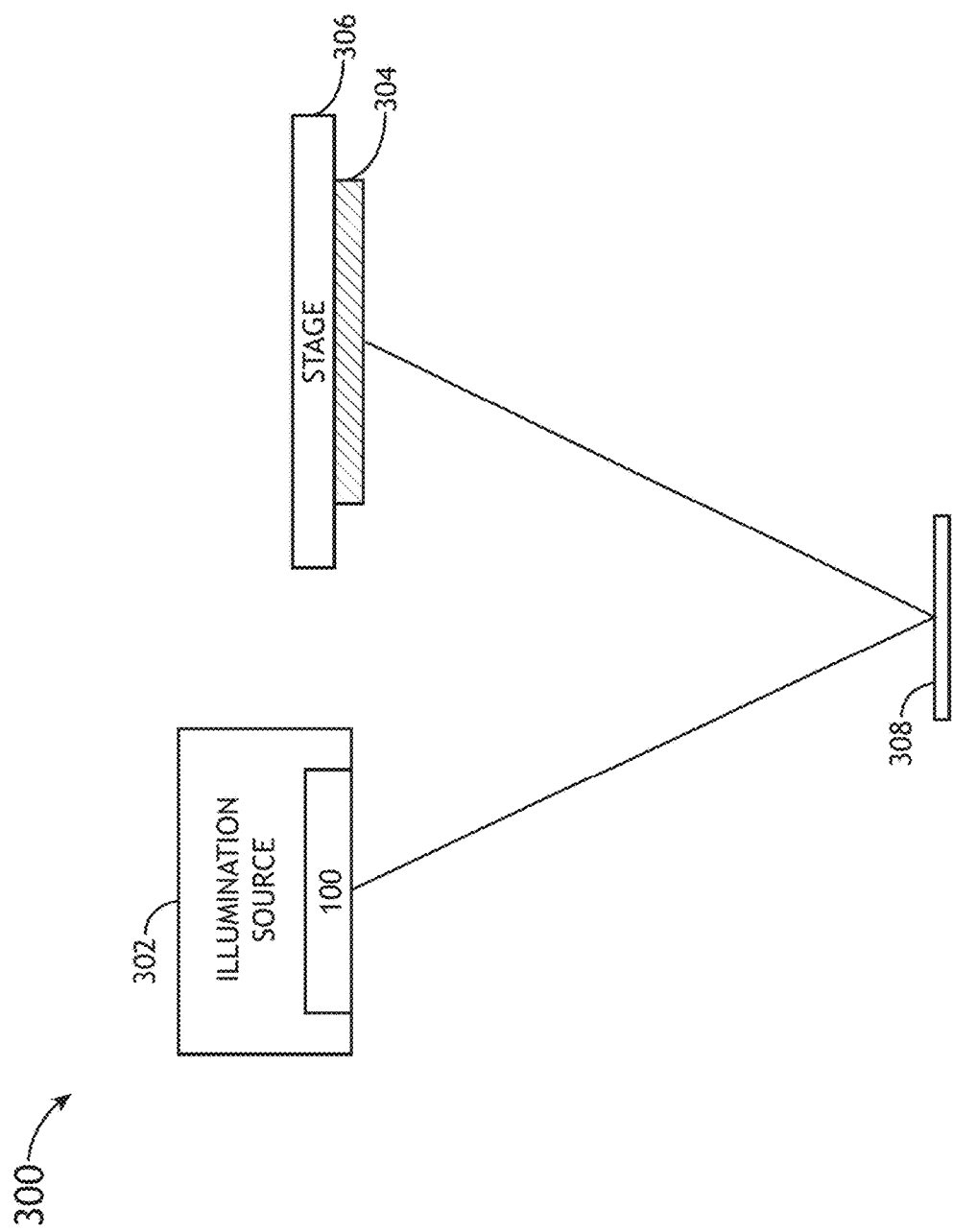
FIG. 24 is a simplified schematic diagram illustrating a lithography system incorporating a light source, in accordance with one or more embodiments of the present disclosure.

For further example, FIG. 24 generally illustrates a photolithography system 300 including an illumination source 302 incorporating a light source, such as a light source 100 described above having one of the droplet generators described herein. The photolithography system may include a stage 306 configured to support at least one substrate 304, such as a semiconductor wafer, for lithography processing. The illumination source 302 may be configured to perform photolithography upon the substrate 304 or a layer disposed upon the substrate 304 with illumination output by the illumination source 302. For example, the output illumination may be directed to a reticle 308 and from the reticle 308 to the substrate 304 to pattern the surface of the substrate 304 or a layer on the substrate 304 in accordance with an illuminated reticle pattern. The exemplary embodiments illustrated in FIGS. 23 and 24 generally depict applications of the light sources described above; however, those skilled in the art will appreciate that the sources can be applied in a variety of contexts without departing from the scope of this disclosure.

Those having skill in the art will further appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. In some embodiments, various steps, functions, and/or operations are carried out by one or more of the following: electronic circuits, logic gates, multiplexers, programmable logic devices, ASICs, analog or digital controls/switches, microcontrollers, or computing systems. A computing system may include, but is not limited to, a personal computing system, mainframe computing system, workstation, image computer, parallel processor, or any other device known in the art. In general, the term "computing system" is broadly defined to encompass any device having one or more processors, which execute instructions from a carrier medium. Program instructions implementing methods such as those described herein may be transmitted over or stored on carrier media. A carrier medium may include a transmission medium such as a wire, cable, or wireless transmission link. The carrier medium may also include a storage medium such as a read-only memory, a random access memory, a magnetic or optical disk, or a magnetic tape.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," "temporarily", or for some period of time. For example, the storage medium may be random access memory (RAM), and the results may not necessarily persist indefinitely in the storage medium.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

What is claimed is:

1. A device comprising:
 a nozzle for dispensing a liquid target material;
 a first intermediary chamber including a first exit aperture to output target material;
 a second intermediary chamber positioned to receive the target material from the exit aperture of the first intermediary chamber, the second intermediary chamber including a second exit aperture to output the liquid target material for downstream irradiation in a laser produced plasma (LPP) chamber,
 a third intermediary chamber positioned to receive target material, the third intermediary chamber formed with an exit aperture to output target material for downstream irradiation in the LPP chamber,
 wherein the second intermediary chamber receives target material from the first intermediary chamber exit aperture, the third intermediary chamber receives target material from the second intermediary chamber exit aperture and wherein the first intermediary chamber exit aperture has a diameter, $d_1$, the second intermediary chamber exit aperture has a diameter, $d_2$, and the third intermediary chamber exit aperture has a diameter, $d_3$, with $d_1 > d_2 > d_3$ to establish an aerodynamic lens,
 wherein the first intermediary chamber contains gaseous xenon at a partial pressure of $p_{Xe1}$, wherein the second intermediary chamber contains gaseous xenon at partial pressure $p_{Xe2}$, wherein $p_{Xe1} > p_{Xe2}$.

2. The device of claim 1, wherein at least one of the first intermediary chamber or the second intermediary chamber includes a channel extending from a first end to a second end with an exit aperture at the second end.

3. The device of claim 1, wherein at least one of the first intermediary chamber or the second intermediary chamber includes a channel extending from a first end to a second end with an exit aperture at the second end and a channel length from the first end to the second end in the range of 20 μm to 500 μm.

4. The device of claim 1, wherein at least one of the first exit aperture or the second exit aperture has a diameter in the range of 100 μm to 1000 μm.

5. The device of claim 2, wherein at least one of the first intermediary chamber or the second intermediary chamber includes an internal surface, the internal surface having a shape selected from the group of shapes consisting of concave, convex, flat and gradually tapering.

6. The device of claim 2, wherein the channel defines an axis and at least one of the first intermediary chamber or the second intermediary chamber includes a concave internal surface.

7. The device of claim 1, wherein at least one of a first environmental control system or a second environmental control system flow a gas different from xenon into at least one of the first intermediary chamber or the second intermediary chamber.

8. The device of claim 1, further comprising a system for controlling gas temperature in at least one of the first intermediary chamber or the second intermediary chamber, wherein the system for controlling gas temperature comprises: at least one of a fin disposed within at least one of the first intermediary chamber or the second intermediary chamber, a fin positioned outside the at least one of the first intermediary chamber or the second intermediary chamber, a Peltier cooling element, a plate formed with an internal fluid passageway for passing a heat transfer fluid through the plate, or an insulated plate.

9. The device of claim 1, further comprising a motorized iris to establish at least one of the first exit aperture or the second exit aperture.

10. A device comprising:
a nozzle for dispensing a liquid target material;
a first intermediary chamber positioned to receive target material, the first intermediary chamber formed with an exit aperture to output target material for downstream irradiation in a laser produced plasma (LPP); and
a second intermediary chamber positioned to receive target material from the first intermediary chamber, the second intermediary chamber formed with an exit aperture to output target material for downstream irradiation in the LPP chamber, wherein the second intermediary chamber is fluidically coupled in-line with the first intermediary chamber;
wherein the first intermediary chamber contains xenon at a partial pressure, $p_1$, and the second intermediary chamber contains xenon at a partial pressure, $p_2$, wherein $p_1$ is greater than $p_2$.

11. The device of claim 10, wherein one or more pumps are configured to provide a measured flow of gas into the first intermediary chamber and a measured flow of gas from the first intermediary chamber.

12. The device of claim 10, wherein the first intermediary chamber contains xenon at a first temperature, $t_1$, and the second intermediary chamber contains xenon at a second temperature, $t_2$, wherein $t_1$ is greater than $t_2$.

13. The device of claim 12, wherein the first temperature is controlled via at least one of a fin disposed within the first intermediary chamber, a fin positioned outside the first intermediary chamber, a Peltier cooling element, or a plate formed with an internal fluid passageway for passing a heat transfer fluid through the plate and an insulated plate.

14. The device of claim 10, further comprising a motorized iris to establish the first intermediary chamber exit aperture.

* * * * *